United States Patent
Chang et al.

(10) Patent No.: US 9,300,420 B2
(45) Date of Patent: Mar. 29, 2016

(54) CARRIER AGGREGATION RECEIVER ARCHITECTURE

(75) Inventors: Li-Chung Chang, Irvine, CA (US); Prasad Srinivasa Siva Gudem, San Diego, CA (US); Frederic Bossu, San Diego, CA (US); Christian Holenstein, La Mesa, CA (US)

(73) Assignee: QUALCOMM Incorporated, San Diego, CA (US)

( * ) Notice: Subject to any disclaimer, the term of this patent is extended or adjusted under 35 U.S.C. 154(b) by 270 days.

(21) Appl. No.: 13/609,532

(22) Filed: Sep. 11, 2012

(65) Prior Publication Data

US 2014/0072001 A1 Mar. 13, 2014

(51) Int. Cl.
*H04J 3/02* (2006.01)
*H04J 3/00* (2006.01)
*H03F 3/72* (2006.01)
*H04B 1/00* (2006.01)

(52) U.S. Cl.
CPC ... *H04J 3/00* (2013.01); *H03F 3/72* (2013.01); *H04B 1/0064* (2013.01); *H04B 1/0071* (2013.01)

(58) Field of Classification Search
CPC ........ H03F 3/72; H03F 3/68; H03F 2200/294
USPC .......................................................... 370/542
See application file for complete search history.

(56) References Cited

U.S. PATENT DOCUMENTS

| 3,911,364 | A | 10/1975 | Langseth et al. |
| 4,035,728 | A | 7/1977 | Ishikawa et al. |
| 4,035,729 | A | 7/1977 | Perry |
| 4,246,655 | A | 1/1981 | Parker |

(Continued)

FOREIGN PATENT DOCUMENTS

| CN | 1523912 A | 8/2004 |
| CN | 1922795 A | 2/2007 |

(Continued)

OTHER PUBLICATIONS

Broyde F., et al., "The Noise Performance of aMultiple-Input-Port and Multiple-Output-Port Low-Noise Amplifier Connected to an Array of Coupled Antennas," International Journal of Antennas and Propagation, vol. 2011, Article ID 438478, Jul. 18, 2011, 12 pages.

(Continued)

*Primary Examiner* — Mark Rinehart
*Assistant Examiner* — Matthew Hopkins
(74) *Attorney, Agent, or Firm* — Liberty E. Mann

(57) ABSTRACT

A receiver architecture for carrier aggregation is disclosed. In an exemplary design, an apparatus (e.g., a wireless device, a circuit module, etc.) includes a plurality of low noise amplifiers (LNAs), a plurality of switches, and at least one downconverter. The LNAs receive and amplify at least one input radio frequency (RF) signal and provide at least one amplified RF signal. The switches are coupled to the outputs of the plurality of LNAs. The at least one downconverter is coupled to the plurality of switches, downconverts the at least one amplified RF signal, and provides at least one downconverted signal. The switches reduce the number of downconverters needed to support reception of transmissions on multiple sets of carriers via multiple receive antennas. The LNAs and the switches may be implemented on at least one front-end module or a back-end module. The downconverter(s) are implemented on the back-end module.

20 Claims, 11 Drawing Sheets

(56) References Cited

U.S. PATENT DOCUMENTS

| | | |
|---|---|---|
| 4,326,294 A | 4/1982 | Okamoto et al. |
| 4,715,048 A | 12/1987 | Masamura |
| 4,742,563 A | 5/1988 | Fukumura |
| 4,756,023 A | 7/1988 | Kojima |
| 4,969,207 A | 11/1990 | Sakamoto et al. |
| 5,056,411 A | 10/1991 | Baker |
| 5,128,630 A | 7/1992 | Mijuskovic |
| 5,291,519 A | 3/1994 | Tsurumaru |
| 5,321,850 A | 6/1994 | Backstrom et al. |
| 5,345,601 A | 9/1994 | Takagi et al. |
| 5,390,342 A | 2/1995 | Takayama et al. |
| 5,559,838 A | 9/1996 | Nakagoshi |
| 5,566,364 A | 10/1996 | Mizoguchi et al. |
| 5,694,396 A | 12/1997 | Firouzbakht et al. |
| 5,697,083 A | 12/1997 | Sano |
| 5,761,613 A | 6/1998 | Saunders et al. |
| 5,794,159 A | 8/1998 | Portin |
| 5,805,643 A | 9/1998 | Seki et al. |
| 5,805,989 A | 9/1998 | Ushida |
| 5,835,853 A | 11/1998 | Enoki et al. |
| 5,940,452 A | 8/1999 | Rich |
| 5,999,815 A | 12/1999 | TenBrook et al. |
| 5,999,990 A | 12/1999 | Sharrit et al. |
| 6,026,288 A | 2/2000 | Bronner |
| 6,040,732 A | 3/2000 | Brokaw |
| 6,044,254 A | 3/2000 | Ohta et al. |
| 6,063,961 A | 5/2000 | Kroner |
| 6,069,923 A | 5/2000 | Ostman et al. |
| 6,088,348 A | 7/2000 | Bell, III et al. |
| 6,208,844 B1 | 3/2001 | Abdelgany |
| 6,249,687 B1 | 6/2001 | Thomsen et al. |
| 6,407,689 B1 | 6/2002 | Bazarjani et al. |
| 6,424,683 B1 | 7/2002 | Schoellhorn |
| 6,430,237 B1 | 8/2002 | Anvari |
| 6,472,947 B1 | 10/2002 | Zeitz |
| 6,473,601 B1 | 10/2002 | Oda |
| 6,522,895 B1 | 2/2003 | Montalvo |
| 6,535,725 B2 | 3/2003 | Hatcher et al. |
| 6,600,759 B1 | 7/2003 | Wood |
| 6,600,907 B1 | 7/2003 | Taguchi |
| 6,600,931 B2 | 7/2003 | Sutton et al. |
| 6,657,498 B2 | 12/2003 | Park et al. |
| 6,806,777 B2 | 10/2004 | Franca-Neto |
| 6,819,941 B2 | 11/2004 | Dening et al. |
| 6,888,888 B1 | 5/2005 | Tu et al. |
| 6,952,594 B2 | 10/2005 | Hendin |
| 6,954,446 B2 | 10/2005 | Kuffner |
| 6,983,132 B2 | 1/2006 | Woo et al. |
| 6,985,712 B2 | 1/2006 | Yamakawa et al. |
| 6,987,950 B2 | 1/2006 | Coan |
| 7,013,166 B2 | 3/2006 | Clifford |
| 7,023,272 B2 | 4/2006 | Hung et al. |
| 7,024,172 B1 | 4/2006 | Murphy et al. |
| 7,039,377 B2 | 5/2006 | Yates |
| 7,123,891 B2 | 10/2006 | Loke |
| 7,142,042 B1 | 11/2006 | Henry |
| 7,161,423 B2 | 1/2007 | Paul et al. |
| 7,167,044 B2 | 1/2007 | Li et al. |
| 7,187,239 B2 | 3/2007 | Yeh |
| 7,187,735 B2 | 3/2007 | Kent, III |
| 7,187,904 B2 | 3/2007 | Gainey et al. |
| 7,212,788 B2 | 5/2007 | Weber et al. |
| 7,224,231 B2 | 5/2007 | Wu |
| 7,260,377 B2 | 8/2007 | Burns et al. |
| 7,283,851 B2 | 10/2007 | Persico et al. |
| 7,299,021 B2 | 11/2007 | Pärssinen et al. |
| 7,313,368 B2 | 12/2007 | Wu et al. |
| 7,317,894 B2 | 1/2008 | Hirose |
| 7,333,831 B2 | 2/2008 | Srinivasan et al. |
| 7,356,325 B2 | 4/2008 | Behzad et al. |
| 7,372,336 B2 | 5/2008 | Lee et al. |
| 7,403,508 B1 | 7/2008 | Miao |
| 7,444,166 B2 | 10/2008 | Sahota |
| 7,454,181 B2 | 11/2008 | Banister et al. |
| 7,477,106 B2 | 1/2009 | Van Bezooijen et al. |
| 7,486,135 B2 | 2/2009 | Mu |
| 7,570,111 B1 | 8/2009 | Vagher et al. |
| 7,599,675 B2 | 10/2009 | Mu et al. |
| 7,643,847 B2 | 1/2010 | Daanen et al. |
| 7,643,848 B2 | 1/2010 | Robinett |
| 7,697,905 B2 | 4/2010 | Lee et al. |
| 7,728,664 B2 | 6/2010 | Chang et al. |
| 7,751,513 B2 | 7/2010 | Eisenhut et al. |
| 7,764,726 B2 | 7/2010 | Simic et al. |
| 7,848,724 B2 | 12/2010 | Bult et al. |
| 7,869,528 B2 | 1/2011 | Robinson |
| 7,877,075 B1 | 1/2011 | Jin et al. |
| 7,911,269 B2 | 3/2011 | Yang et al. |
| 7,944,298 B2 | 5/2011 | Cabanillas et al. |
| 7,949,309 B2 | 5/2011 | Rofougaran et al. |
| 7,952,398 B2 | 5/2011 | Salcido et al. |
| 8,022,772 B2 | 9/2011 | Cassia et al. |
| 8,055,229 B2 | 11/2011 | Huang |
| 8,063,706 B2 | 11/2011 | Li et al. |
| 8,081,672 B2 | 12/2011 | Kent et al. |
| 8,090,332 B2 | 1/2012 | Sahota et al. |
| 8,090,369 B2 | 1/2012 | Kitazoe |
| 8,139,670 B1 * | 3/2012 | Son et al. ............... 375/267 |
| 8,149,955 B2 | 4/2012 | Tired |
| 8,195,117 B2 | 6/2012 | Bult et al. |
| 8,208,887 B2 | 6/2012 | Lee et al. |
| 8,217,723 B2 | 7/2012 | Rajendran et al. |
| 8,242,841 B2 | 8/2012 | Zhang |
| 8,270,927 B2 | 9/2012 | Wallace et al. |
| 8,290,449 B2 | 10/2012 | Keehr et al. |
| 8,295,778 B2 | 10/2012 | Kotecha et al. |
| 8,306,494 B2 | 11/2012 | Ojo |
| 8,442,473 B1 | 5/2013 | Kaukovuori et al. |
| 8,514,015 B2 | 8/2013 | Chen |
| 8,571,510 B2 | 10/2013 | Liu et al. |
| 8,600,315 B2 | 12/2013 | Roufoogaran et al. |
| 8,626,084 B2 | 1/2014 | Chan et al. |
| 8,676,148 B2 | 3/2014 | Ogasawara |
| 8,706,069 B2 | 4/2014 | Khoini-Poorfard et al. |
| 2002/0008575 A1 | 1/2002 | Oskowsky et al. |
| 2002/0061773 A1 | 5/2002 | Adachi et al. |
| 2002/0111163 A1 | 8/2002 | Hamabe |
| 2002/0132597 A1 | 9/2002 | Peterzell et al. |
| 2002/0173337 A1 | 11/2002 | Hajimiri et al. |
| 2002/0193108 A1 | 12/2002 | Robinett |
| 2003/0076797 A1 | 4/2003 | Lozano |
| 2003/0081694 A1 | 5/2003 | Wieck |
| 2003/0125040 A1 | 7/2003 | Walton et al. |
| 2003/0148750 A1 | 8/2003 | Yan et al. |
| 2003/0157915 A1 | 8/2003 | Atkinson et al. |
| 2003/0176176 A1 | 9/2003 | Leinonen et al. |
| 2003/0203743 A1 | 10/2003 | Sugar et al. |
| 2003/0206076 A1 | 11/2003 | Hashemi et al. |
| 2003/0228851 A1 | 12/2003 | Taniguchi |
| 2004/0087290 A1 | 5/2004 | Schmidt et al. |
| 2004/0092243 A1 | 5/2004 | Hey-Shipton |
| 2004/0113746 A1 | 6/2004 | Brindle |
| 2004/0116086 A1 | 6/2004 | Huttunen |
| 2004/0121753 A1 | 6/2004 | Sugar et al. |
| 2004/0204104 A1 | 10/2004 | Horng et al. |
| 2004/0219959 A1 | 11/2004 | Khayrallah et al. |
| 2004/0224643 A1 | 11/2004 | Nakai |
| 2004/0253955 A1 | 12/2004 | Love et al. |
| 2004/0266356 A1 | 12/2004 | Javor et al. |
| 2005/0039060 A1 | 2/2005 | Okayasu |
| 2005/0075077 A1 | 4/2005 | Mach et al. |
| 2005/0079847 A1 | 4/2005 | Arafa |
| 2005/0118977 A1 | 6/2005 | Drogi et al. |
| 2005/0197090 A1 | 9/2005 | Stockstad et al. |
| 2005/0215264 A1 | 9/2005 | Subramaniam et al. |
| 2005/0231290 A1 | 10/2005 | Hung et al. |
| 2005/0265084 A1 | 12/2005 | Choi |
| 2005/0277387 A1 | 12/2005 | Kojima et al. |
| 2006/0009177 A1 * | 1/2006 | Persico et al. ............... 455/143 |
| 2006/0023745 A1 | 2/2006 | Koo et al. |
| 2006/0061773 A1 | 3/2006 | Lee et al. |
| 2006/0121937 A1 * | 6/2006 | Son ............... 455/553.1 |
| 2006/0128322 A1 | 6/2006 | Igarashi et al. |
| 2006/0146693 A1 | 7/2006 | Mori et al. |

(56) References Cited

U.S. PATENT DOCUMENTS

| | | |
|---|---|---|
| 2006/0170503 A1 | 8/2006 | Lee et al. |
| 2006/0189286 A1 | 8/2006 | Kyu et al. |
| 2006/0222100 A1* | 10/2006 | Behzad .......................... 375/267 |
| 2006/0234662 A1 | 10/2006 | Diloisy |
| 2006/0291428 A1 | 12/2006 | Filipovic |
| 2007/0049332 A1 | 3/2007 | Higuchi |
| 2007/0060080 A1 | 3/2007 | Nishimura et al. |
| 2007/0072577 A1 | 3/2007 | Rozenblit et al. |
| 2007/0105517 A1 | 5/2007 | Chang et al. |
| 2007/0142013 A1 | 6/2007 | Bucknor et al. |
| 2007/0177656 A1 | 8/2007 | Maruta et al. |
| 2007/0177693 A1 | 8/2007 | Kluge |
| 2007/0184801 A1 | 8/2007 | Kogawa et al. |
| 2007/0197170 A1 | 8/2007 | Boos |
| 2007/0197178 A1 | 8/2007 | Gu |
| 2007/0197204 A1 | 8/2007 | Herczog et al. |
| 2007/0202890 A1 | 8/2007 | Feher |
| 2007/0242784 A1 | 10/2007 | Sampson et al. |
| 2007/0243832 A1 | 10/2007 | Park et al. |
| 2007/0262817 A1 | 11/2007 | Ciccarelli et al. |
| 2007/0262871 A1 | 11/2007 | Yamagajo et al. |
| 2008/0004078 A1 | 1/2008 | Barratt et al. |
| 2008/0013654 A1 | 1/2008 | Rick et al. |
| 2008/0116976 A1 | 5/2008 | Chang et al. |
| 2008/0117999 A1 | 5/2008 | Kadous et al. |
| 2008/0139151 A1 | 6/2008 | Ojo et al. |
| 2008/0204148 A1 | 8/2008 | Kim et al. |
| 2008/0224770 A1 | 9/2008 | Kim et al. |
| 2008/0224791 A1 | 9/2008 | Cheng |
| 2008/0225971 A1 | 9/2008 | Behzad |
| 2008/0261650 A1 | 10/2008 | Piriyapoksombut et al. |
| 2008/0297259 A1 | 12/2008 | Mu |
| 2009/0124227 A1 | 5/2009 | Ishiguro |
| 2009/0227214 A1 | 9/2009 | Georgantas et al. |
| 2009/0237161 A1 | 9/2009 | Fagg |
| 2009/0243869 A1 | 10/2009 | Sanderford, Jr. |
| 2009/0253456 A1 | 10/2009 | Toh et al. |
| 2009/0290659 A1 | 11/2009 | Petrovic et al. |
| 2009/0323779 A1 | 12/2009 | Lennen |
| 2010/0019970 A1 | 1/2010 | Farrokhi et al. |
| 2010/0034094 A1 | 2/2010 | Tenny |
| 2010/0040178 A1 | 2/2010 | Sutton et al. |
| 2010/0041359 A1* | 2/2010 | Liu et al. .......................... 455/311 |
| 2010/0142440 A1 | 6/2010 | Inoue |
| 2010/0195754 A1 | 8/2010 | Li et al. |
| 2010/0197263 A1 | 8/2010 | Dwyer et al. |
| 2010/0210226 A1 | 8/2010 | Matsuyama |
| 2010/0210272 A1 | 8/2010 | Sundstrom et al. |
| 2010/0210299 A1 | 8/2010 | Gorbachov |
| 2010/0214184 A1 | 8/2010 | Tran et al. |
| 2010/0225414 A1 | 9/2010 | Gorbachov |
| 2010/0226327 A1 | 9/2010 | Zhang et al. |
| 2010/0232493 A1 | 9/2010 | Thirumoorthy |
| 2010/0237947 A1 | 9/2010 | Xiong et al. |
| 2010/0253435 A1 | 10/2010 | Ichitsubo et al. |
| 2010/0265875 A1 | 10/2010 | Zhao et al. |
| 2010/0271986 A1 | 10/2010 | Chen |
| 2010/0272051 A1 | 10/2010 | Fu et al. |
| 2010/0301946 A1 | 12/2010 | Borremans |
| 2010/0311378 A1 | 12/2010 | Tasic et al. |
| 2010/0328155 A1 | 12/2010 | Simic et al. |
| 2010/0330977 A1 | 12/2010 | Kadous et al. |
| 2011/0018635 A1 | 1/2011 | Tasic et al. |
| 2011/0044380 A1 | 2/2011 | Marra et al. |
| 2011/0050319 A1 | 3/2011 | Wong |
| 2011/0084791 A1 | 4/2011 | Mun et al. |
| 2011/0086603 A1 | 4/2011 | Toosi et al. |
| 2011/0110463 A1 | 5/2011 | Chang et al. |
| 2011/0122972 A1 | 5/2011 | Lie et al. |
| 2011/0165848 A1 | 7/2011 | Gorbachov et al. |
| 2011/0193625 A1 | 8/2011 | Gatta et al. |
| 2011/0194504 A1 | 8/2011 | Gorokhov et al. |
| 2011/0204973 A1 | 8/2011 | Hu et al. |
| 2011/0211533 A1 | 9/2011 | Casaccia et al. |
| 2011/0217945 A1* | 9/2011 | Uehara et al. .................. 455/341 |
| 2011/0222443 A1 | 9/2011 | Khlat |
| 2011/0222444 A1 | 9/2011 | Khlat et al. |
| 2011/0242999 A1 | 10/2011 | Palanki et al. |
| 2011/0250926 A1 | 10/2011 | Wietfeldt et al. |
| 2011/0268048 A1 | 11/2011 | Toskala et al. |
| 2011/0268232 A1 | 11/2011 | Park et al. |
| 2011/0292844 A1 | 12/2011 | Kwun et al. |
| 2011/0299434 A1 | 12/2011 | Gudem et al. |
| 2011/0300810 A1 | 12/2011 | Mikhemar et al. |
| 2012/0009886 A1 | 1/2012 | Poulin |
| 2012/0013387 A1 | 1/2012 | Sankaranarayanan et al. |
| 2012/0026862 A1 | 2/2012 | Sadri et al. |
| 2012/0044927 A1 | 2/2012 | Pan et al. |
| 2012/0056681 A1 | 3/2012 | Lee |
| 2012/0057621 A1 | 3/2012 | Hong et al. |
| 2012/0195237 A1 | 8/2012 | Chan et al. |
| 2012/0236829 A1 | 9/2012 | Takano et al. |
| 2012/0293265 A1 | 11/2012 | Heikkinen et al. |
| 2012/0294299 A1 | 11/2012 | Fernando |
| 2012/0327825 A1 | 12/2012 | Gudem et al. |
| 2012/0329395 A1 | 12/2012 | Husted et al. |
| 2013/0003617 A1 | 1/2013 | Gudem et al. |
| 2013/0003783 A1 | 1/2013 | Gudem et al. |
| 2013/0043946 A1 | 2/2013 | Hadjichristos et al. |
| 2013/0051284 A1 | 2/2013 | Khlat |
| 2013/0114769 A1 | 5/2013 | Fernando |
| 2013/0163492 A1 | 6/2013 | Wong |
| 2013/0217398 A1 | 8/2013 | Winiecki et al. |
| 2013/0230080 A1 | 9/2013 | Gudem et al. |
| 2013/0231064 A1 | 9/2013 | Gudem et al. |
| 2013/0265892 A1 | 10/2013 | Fernando |
| 2013/0315348 A1 | 11/2013 | Tasic et al. |
| 2013/0316668 A1 | 11/2013 | Davierwalla et al. |
| 2013/0316669 A1 | 11/2013 | Davierwalla et al. |
| 2013/0316670 A1 | 11/2013 | Tasic et al. |
| 2013/0329665 A1 | 12/2013 | Kadous et al. |
| 2014/0113578 A1 | 4/2014 | Xu |
| 2014/0269853 A1 | 9/2014 | Gudem et al. |

FOREIGN PATENT DOCUMENTS

| | | |
|---|---|---|
| CN | 101228702 A | 7/2008 |
| CN | 101242158 A | 8/2008 |
| CN | 101523967 A | 9/2009 |
| CN | 101789805 A | 7/2010 |
| EP | 1164719 A1 | 12/2001 |
| EP | 1370012 | 12/2003 |
| EP | 1398887 A1 | 3/2004 |
| EP | 1708372 A2 | 10/2006 |
| EP | 1726098 A1 | 11/2006 |
| EP | 1748567 A2 | 1/2007 |
| EP | 1761076 A2 | 3/2007 |
| EP | 2068583 A1 | 6/2009 |
| EP | 2141818 A1 | 1/2010 |
| EP | 1916767 B1 | 12/2010 |
| EP | 2393205 A2 | 12/2011 |
| EP | 2398285 A1 | 12/2011 |
| GB | 2472978 A | 3/2011 |
| JP | 05227234 | 9/1993 |
| JP | H0730452 A | 1/1995 |
| JP | 07221684 | 8/1995 |
| JP | 9027778 A | 1/1997 |
| JP | 09116458 | 5/1997 |
| JP | H11127300 A | 5/1999 |
| JP | 2000013278 A | 1/2000 |
| JP | 2001285114 | 10/2001 |
| JP | 2002261880 A | 9/2002 |
| JP | 2004015162 A | 1/2004 |
| JP | 2006520143 A | 8/2006 |
| JP | 2007324711 A | 12/2007 |
| JP | 2008085793 A | 4/2008 |
| JP | 2008519535 A | 6/2008 |
| JP | 2009130867 A | 6/2009 |
| JP | 2011015112 A | 1/2011 |
| JP | 2011082669 A | 4/2011 |
| JP | 2011091747 A | 5/2011 |
| JP | 2011119807 A | 6/2011 |
| WO | WO0150636 | 7/2001 |
| WO | 0237686 | 5/2002 |

(56) References Cited

FOREIGN PATENT DOCUMENTS

| WO | WO2005039060 | | 4/2005 |
|---|---|---|---|
| WO | 2005062477 | A2 | 7/2005 |
| WO | WO2005064816 | A1 | 7/2005 |
| WO | 2005088847 | A1 | 9/2005 |
| WO | 2006050515 | A2 | 5/2006 |
| WO | 2006118538 | A2 | 11/2006 |
| WO | 2008059257 | A1 | 5/2008 |
| WO | 2008084539 | A1 | 7/2008 |
| WO | 08103757 | | 8/2008 |
| WO | WO2008092745 | A1 | 8/2008 |
| WO | 2008145604 | A1 | 12/2008 |
| WO | 2010059257 | A1 | 5/2010 |
| WO | 2011019850 | A1 | 2/2011 |
| WO | WO2011050729 | A1 | 5/2011 |
| WO | WO2011092005 | A1 | 8/2011 |
| WO | 2011138697 | A1 | 11/2011 |
| WO | 2012008705 | A2 | 1/2012 |
| WO | 2012049529 | A1 | 4/2012 |
| WO | 2013036794 | A1 | 3/2013 |
| WO | 2013131047 | | 9/2013 |

OTHER PUBLICATIONS

Chen, et al, "A 5-6 GHz 1-V CMOS Direct-Conversion Receiver With an Integrated Quadrature Coupler," IEEE Journal of Solid-State Circuits, vol. 42, No. 9, 2007, pp. 1963-1975.

Chen, et al., "A monolithic 5.9-GHz CMOS I/Q direct-down converter utilizing a quadrature coupler and transformer-coupled subharmonic mixers," Microwave and Wireless Components Letters, IEEE, vol. 16, No. 4, 2006, pp. 197- 199.

Garuda, et al., "A Multi-band CMOS RF Front-end for 4G WiMAX and WLAN Applications," 2006 IEEE International Symposium on Circuits and Systes, 2006. ISCAS 2006. May 2006, 4 pages.

Hashemi, et al., "Concurrent Multiband Low-Noise Amplifiers—Theory, Design, and Applications," IEEE Transactions on Microwave Theory and Techniques, vol. 50, No. 1, Jan. 2002.

Jones W. W., et al., "Narrowband interference suppression using filter-bank analysis/synthesis techniques", Military Communications Conference, 1992. MILCOM '92, Conference Recor D. Communications—Fusing Command, Control and Intelligence., IEEE San Diego, CA, USA, Oct. 11-14, 1992, New York, NY, USA, IEEE, US, Oct. 11, 1992, pp. 898-902, XP010060840, DOI: 10.1109/Milcom.1992.243977, ISBN: 978-0-7803-0585-4.

Kim, T.W., et al., Highly Linear Receiver Front-End Adopting MOSFET Transconductance Linearization by Multiple Gated Transistors, IEEE Journal of Solid-State Circuits, United States, IEEE, Jan. 1, 2004, vol. 39, No. 1, pp. 223-229.

Lai, C.M.,et al., "Compact router transceiver architecture for carrier aggregation systems", Microwave Conference (EUMC), 2011 41st European, IEEE, Oct. 10, 2011, pp. 693-696, XP032072825, ISBN: 978-1-61284-235-6 the whole document.

Qualcomm Europe: "UE Implementation Impact due to 4C-HSDPA Operation", 3GPP Draft; R1-094067_UE_IMPL_IMPACT_4C_HSDPA, 3RD Generation Partnership Project (3GPP), Mobile Competence Centre; 650, Route Des Lucioles; F-06921 Sophia-Antipolis Cedex ; France, no. Miyazaki; Oct. 12, 2009, XP050388547, [retrieved on Oct. 6, 2009].

Rahn D.G., et al., "A fully integrated multiband MIMO WLAN transceiver RFIC," IEEE J. Solid-State Circuits, 2005, vol. 40 (8), 1629-1641.

Philips: "Capabilities of multi-transceiver UES", 3GPP Draft; R1-103913, 3rd Generation Partnership Project (3GPP), Mobile Competence Centre; 650, Route Des Lucioles; F-06921 Sophia-Antipolis Cedex; France, vol. RAN WG1, no. Dresden, Germany; Jun. 22, 2010, XP050449298, [retrieved on Jun. 22, 2010] the whole document.

3GPP TS 36.101 V11.0.0, 3rd Generation Partnership Project; Technical Specification Group Radio Access Network; Evolved Universal Terrestrial Radio Access (E-UTRA); User Equipment (UE) radio transmission and reception (Release 11), Mar. 2012.

Aparin et al., "A Highly-integrated tri-band/quad-mode SiGe BiCMOS RF-to-baseband and receiver for wireless CDMA/WCDMA/AMPS applications with GPS capability", Solid-State Circuits Conference, 2002. Digest of Technical Papers. 2002 IEEE International Feb. 3-7, 2002, Piscataway, NJ, USA, IEEE, vol. 1, 2002, pp. 234-235, XP010585547, ISBN: 0-7803-7335-9.

Henrik Morkner et al.,"A Full Duplex Front End Module for WiFi 802.11.n. Applications", European Microwave Association, vol. 12, No. 4, pp. 162-165, Oct. 2008.

Hwang, et al., "A High IIP2 Direct-Conversion Receiver using Even-Harmonic Reduction Technique for Cellular CDMA/PCS/GPS applications," IEEE Transaction on Circuits and Systems.

Jussi Ryynanen et al., "A Dual-Band RF Front-End for WCDMA and GSM Applications", IEEE, Journal Solid-State Circuits, 2001, vol. 36, No. 8, pp. 1198-1204.

Kevin Walsh et al., "3G/4G Multimode Cellular Front End Challenges", Part 2: Architecture Discussion, RFMD® White Paper, 9 pages.

Lee et al., "Development of Miniature Quad SAW filter bank based on PCB substrate", IEEE Intl Frequency Control Symp, pp. 146-149, 2007.

MSM6000 Chipset Solution, Qualcomm Incorporated.

MSM6500 Chipset Solution, Qualcomm Incorporated.

Pitschi M. et al., "High Performance Microwave Acoustic Components for Mobile Radios", Ultrasonics Symposium (IUS), 2009 IEEE International, EPCOS AG, Munich, Germany, vol. 1, Sep. 20-23, 2009.

Sever et al. "A Dual-Antenna Phase-Array Ultra-Wideband CMOS Transceiver". IEEE Communications Magazine [Online] 2006, vol. 44, Issue 8, pp. 102-110. See pp. 104-107.

Tasic A. et al., "Design of Adaptive Multimode RF Front-End Circuits", IEEE Journal of Solid-State Circuits, vol. 42, Issue 2, Feb. 2007 pp. 313-322.

"UMTS Picocell Front End Module", CTS Corp. 8 pages.

Winternitz, et al., "A GPS Receiver for High-Altitude Satellite Navigation," IEEE Journal of Selected Topics in Signal Processing, vol. 3, No. 4, pp. 541-556, Aug. 2009.

International Search Report and Written Opinion—PCT/US2013/059308—ISA/EPO—Nov. 26, 2013.

* cited by examiner

CARRIER AGGREGATION RECEIVER ARCHITECTURE

BACKGROUND

I. Field

The present disclosure relates generally to electronics, and more specifically to a receiver architecture for a wireless device.

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an output RF signal having the proper output power level, and transmit the output RF signal via an antenna to a base station. For data reception, the receiver may obtain a received RF signal via the antenna and may amplify and process the received RF signal to recover data sent by the base station.

A wireless device may support carrier aggregation, which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, a cell, etc. It is desirable to efficiently support carrier aggregation by the wireless device.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

A receiver architecture suitable for carrier aggregation and having various advantages is disclosed herein. The receiver architecture may be used for various types of electronic devices such as wireless communication devices.

Figure 1:
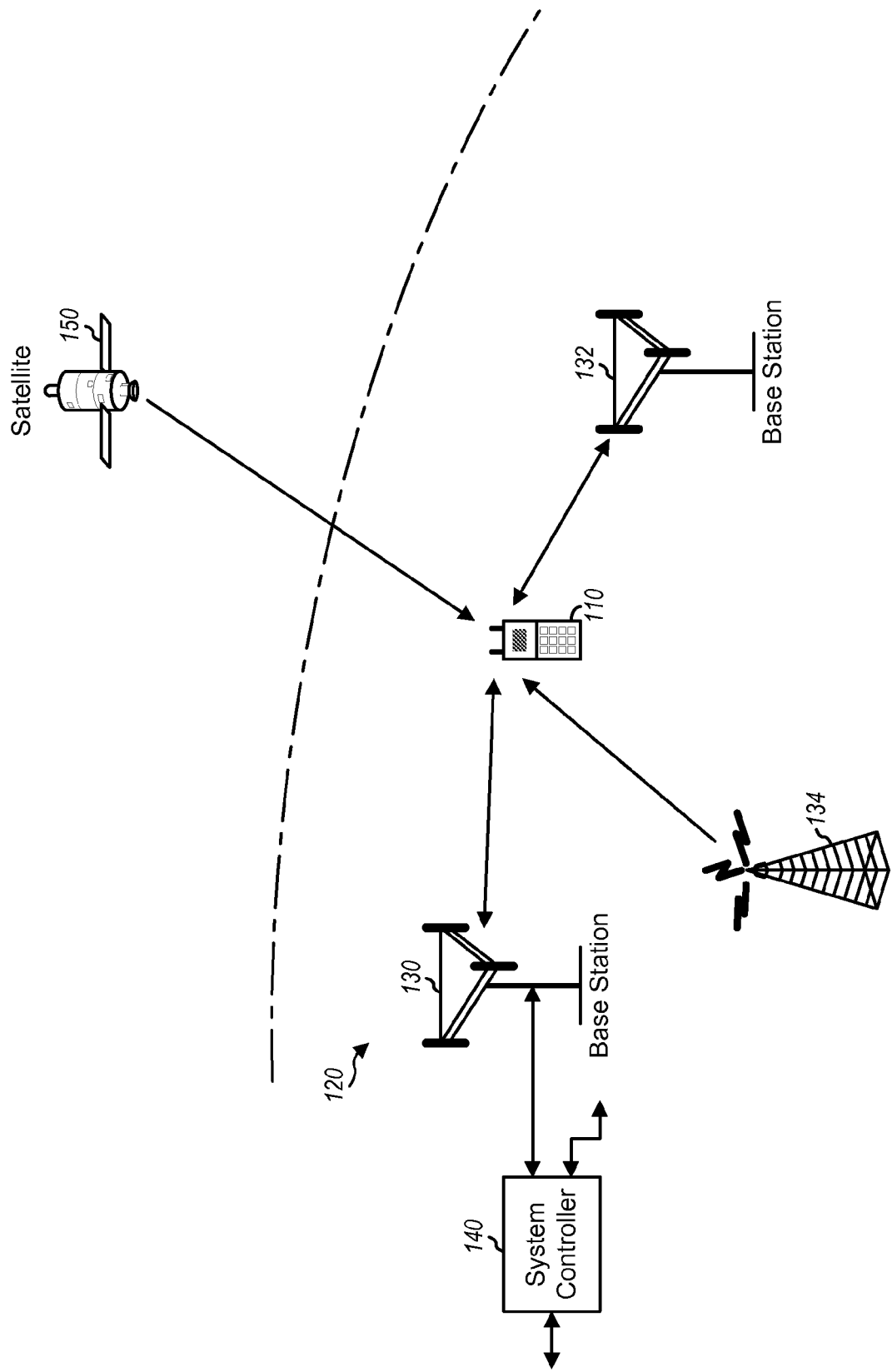
FIG. 1 shows a wireless device communicating with a wireless system.

FIG. 1 shows a wireless device 110 capable of communicating with a wireless communication system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), Time Division Synchronous CDMA (TD-SCDMA), cdma2000, or some other version of CDMA. For simplicity, FIG. 1 shows wireless system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120. Wireless device 110 may also be capable of receiving signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, cdma2000, WCDMA, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band from 698 to 960 megahertz (MHz), mid-band from 1475 to 2170 MHz, and/or high-band from 2300 to 2690 and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to 5 carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
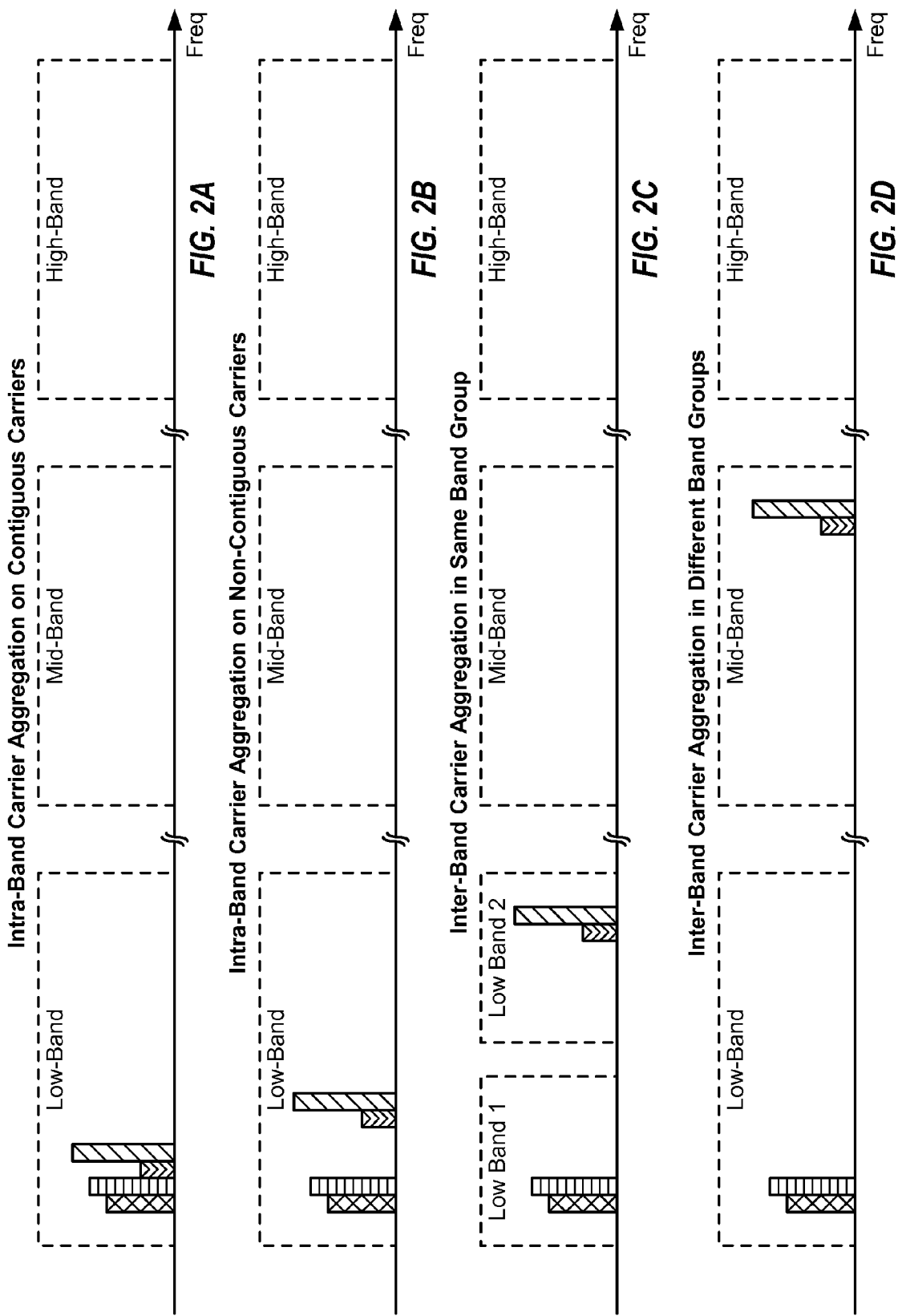
FIGS. 2A to 2D show four examples of carrier aggregation (CA).

FIG. 2A shows an example of contiguous intra-band CA. In the example shown in FIG. 2A, wireless device 110 is configured with four contiguous carriers in the same band, which is a band in low-band. Wireless device 110 may send and/or receive transmissions on multiple contiguous carriers within the same band.

FIG. 2B shows an example of non-contiguous intra-band CA. In the example shown in FIG. 2B, wireless device 110 is configured with four non-contiguous carriers in the same band, which is a band in low-band. The carriers may be separated by 5 MHz, 10 MHz, or some other amount. Wireless device 110 may send and/or receive transmissions on multiple non-contiguous carriers within the same band.

FIG. 2C shows an example of inter-band CA in the same band group. In the example shown in FIG. 2C, wireless device 110 is configured with four carriers in two bands in the same band group, which is low-band. Wireless device 110 may send and/or receive transmissions on multiple carriers in different bands in the same band group (e.g., low-band in FIG. 2C).

FIG. 2D shows an example of inter-band CA in different band groups. In the example shown in FIG. 2D, wireless device 110 is configured with four carriers in two bands in different band groups, which include two carriers in one band in low-band and two additional carriers in another band in mid-band. Wireless device 110 may send and/or receive transmissions on multiple carriers in different bands in different band groups (e.g., low-band and mid-band in FIG. 2D).

FIGS. 2A to 2D show four examples of carrier aggregation. Carrier aggregation may also be supported for other combinations of bands and band groups. For example, carrier aggregation may be supported for low-band and high-band, mid-band and high-band, high-band and high-band, etc.

Figure 3:
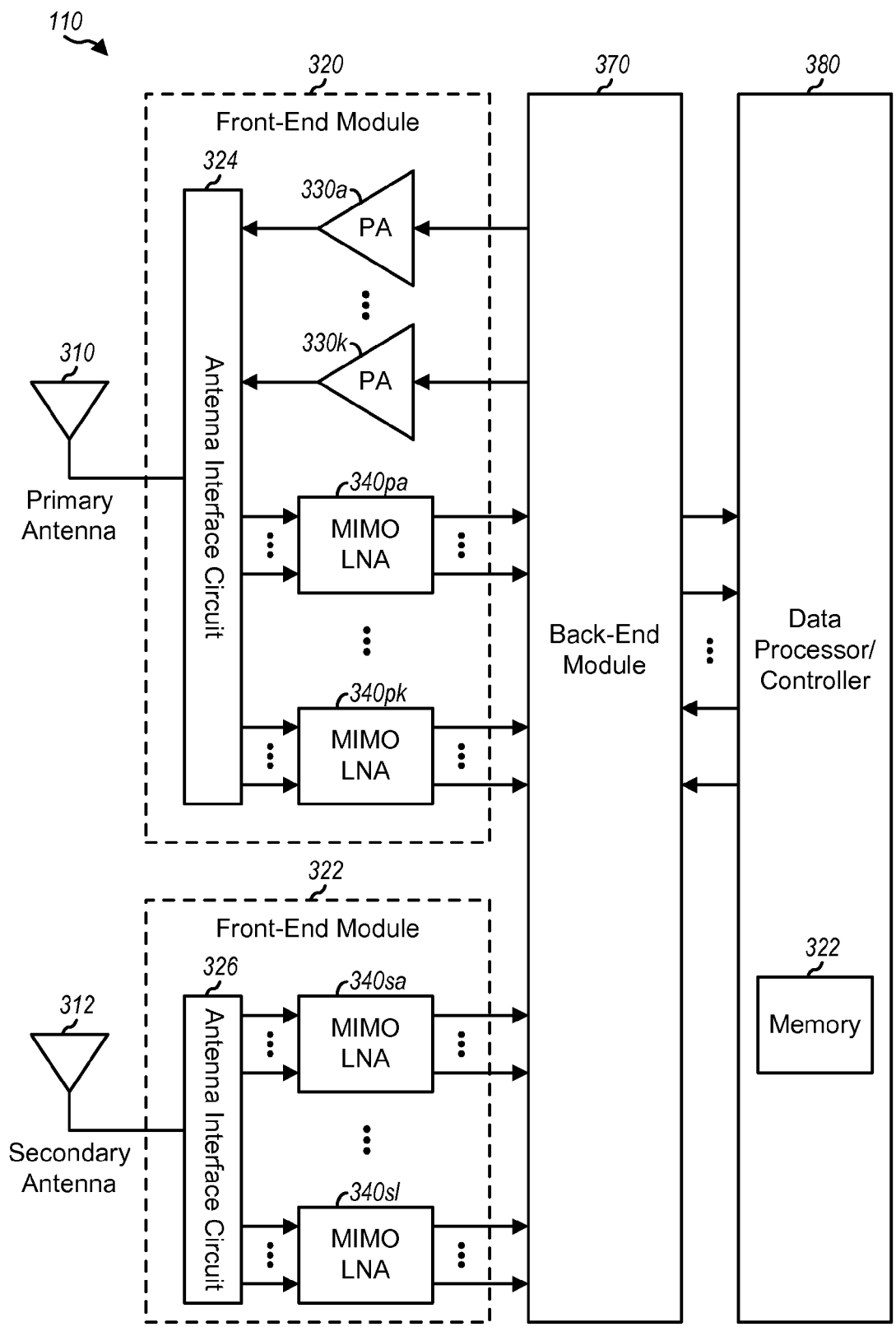
FIG. 3 shows a block diagram of the wireless device in FIG. 1.

FIG. 3 shows a block diagram of an exemplary design of wireless device 110 in FIG. 1. In this exemplary design, wireless device 110 includes a front-end module 320 coupled to a primary antenna 310, a front-end module 322 coupled to a secondary antenna 312, a back-end module 370, and a data processor/controller 380.

In the exemplary design shown in FIG. 3, front-end module 320 includes an antenna interface circuit 324, multiple (K) power amplifiers (PAs) 330a to 330k, and multiple (K) MIMO LNAs 340pa to 340pk to support multiple bands, carrier aggregation, multiple radio technologies, etc. Front-end module 322 includes an antenna interface circuit 326 and multiple (L) MIMO LNAs 340sa to 340sl to support multiple bands, carrier aggregation, multiple radio technologies, receive diversity, MIMO transmission from multiple transmit antennas to multiple receive antennas, etc.

Antenna interface circuit 324 may obtain a received RF signal from antenna 310 and may provide one or more input RF signals to one or more MIMO LNAs 340. Antenna interface circuit 324 may also receive an output RF signal from one power amplifier 330 and may provide the output RF signal to antenna 310. Antenna interface circuit 324 may include switches, duplexers, transmit filters, receive filters, matching circuits, etc. Antenna interface circuit 326 may obtain a received RF signal from antenna 312 and may provide one or more input RF signals to one or more MIMO LNAs 340. Antenna interface circuit 326 may include switches, receive filters, matching circuits, etc.

Each MIMO LNA 340 includes (i) N inputs that can receive up to N input RF signals from antenna interface circuit 324 or 326 and (ii) M outputs that can provide up to M amplified RF signals to back-end module 370, where N>1 and M>1. MIMO LNA 340pa to 340pk and MIMO LNAs 340sa to 340sl may include the same or different numbers of inputs and may also include the same or different numbers of outputs. Hence, N and M may be the same for all MIMO LNAs 340 or different for different MIMO LNAs 340. A MIMO LNA with N inputs and M outputs may be referred to as an N×M MIMO LNA.

MIMO LNAs 340 may be used to receive transmissions on multiple carriers at different frequencies. A MIMO LNA is different from LNAs used to receive a MIMO transmission sent from multiple transmit antennas to multiple receive antennas. An LNA for a MIMO transmission typically has (i) one input receiving one input RF signal from one receive antenna and (ii) one output providing one amplified RF signal. The multiple outputs of a MIMO LNA thus cover frequency dimension whereas the outputs of LNAs used for a MIMO transmission cover spatial dimension.

Each MIMO LNA 340 may operate in a single-output mode, an intra-band CA mode, an inter-band same band group CA mode, or an inter-band different band groups CA mode at any given moment. The single-output mode may be used to receive a transmission sent on a single carrier without carrier aggregation or transmissions sent on multiple carriers with carrier aggregation. In the single-output mode or the inter-band different band groups CA mode, a MIMO LNA operates in a 1×1 configuration, receives one input RF signal comprising one or more transmissions on one set of carriers in one band, and provides one amplified RF signal. In the intra-band CA mode, the MIMO LNA operates in a 1×M configuration, receives one input RF signal comprising multiple transmissions on M sets of carriers in the same band, and provides M amplified RF signals for the M sets of carriers. In the inter-band same band group CA mode, the MIMO LNA operates in an N×M configuration, receives N input RF signals comprising multiple transmissions on M sets of carriers in up to N bands, and provides M amplified RF signals for the M sets of carriers. Each set of carriers may include one or more carriers. Each carrier may have a bandwidth of 1.4, 3, 5, 10, 15 or 20 MHz in LTE.

Back-end module 370 includes various circuits to condition signals for transmission via antenna 310, such as amplifiers, filters, upconverters, matching circuits, oscillators, local oscillator (LO) generators, phase-locked loops (PLL), etc. Back-end module 370 also includes various circuits to condition signals received via antennas 310 and 312, such as downconverters, filters, amplifiers, matching circuits, oscillators, LO generators, PLLs, etc. Back-end module 370 also includes switches and signal traces to interconnect MIMO LNAs 340 to downconverters within back-end module 370, as described below. Back-end module 370 may also be referred to as a transceiver module.

Front-end modules 320 and 322 and back-end module 370 may be implemented in various manners. In one exemplary design, modules 320, 322 and 370 may each be implemented on one or more analog integrated circuit (ICs), RF ICs (RFICs), mixed-signal ICs, circuit modules, etc. For example, modules 320, 322 and 370 may each be implemented on a separate RFIC or circuit module. Antenna interface circuits 324 and 326 may be implemented on (i) the same ICs or circuit modules as PAs 330 and LNAs 340 or (ii) separate ICs or circuit modules. Front-end modules 320 and 322 and back-end module 370 may also be implemented in other manners.

Data processor/controller 380 may perform various functions for wireless device 110. For example, data processor 380 may perform processing for data being received by wireless device 110 and data being transmitted by wireless device 110. Controller 380 may control the operation of various circuits in front-end modules 320 and 322 and back-end module 370. A memory 382 may store program codes and data for data processor/controller 380. Data processor/controller 380 may be implemented on one or more application specific integrated circuits (ASICs) and/or other ICs.

Wireless device 110 may support a number of bands and may also support carrier aggregation. Hence, antenna interface circuits 324 and 324 may provide a large number of input RF signals for all supported bands and for carrier aggregation. Implementing antenna interface circuit 324 and MIMO LNAs 340pa to 340pk together on the same front-end module 320 may avoid the need for RF interconnections between antenna interface circuit 324 and MIMO LNAs 340. Similarly, implementing antenna interface circuit 326 and MIMO LNAs 340sa to 340sk together on the same front-end module 322 may avoid the need for RF interconnections between antenna interface circuit 326 and MIMO LNAs 340.

However, by including MIMO LNAs 340 in front-end modules 320 and 322 instead of back-end module 370, there may be a large number of RF interconnections between front-end modules 320 and 322 and back-end module 370, or more specifically, between MIMO LNAs 340 and back-end module 370. This may then require a large number of input/output (I/O) pins on front-end modules 320 and 322 and back-end module 370. The number of I/O pins may increase in proportion to the number of LNAs interfacing with antenna interface circuits 324 and 326. As a result, package area of front-end modules 320 and 322, die area of back-end module 370, and routing area of a printed circuit board (PCB) containing front-end modules 320 and 322 and back-end module 370 may increase significantly.

The carrier aggregation receiver architecture described herein may provide various advantages. First, the receiver architecture may reduce the number of RF interconnections between front-end modules 322 and 322 and back-end module 370, which may then reduce the number of I/O pins on modules 320, 322 and 370. Second, the receiver architecture may reduce package area of front-end modules 320 and 322, die area of back-end module 370, and routing area of a PCB containing modules 320, 322 and 370.

In an exemplary design, wireless device 110 may simultaneously receive transmissions on up to two sets of carriers in up to two band groups. Each set of carriers may include one or more carriers on which transmissions can be sent to wireless device 110. Wireless device 110 may perform downconversion separately for each set of carriers on which transmissions are sent to wireless device 110. Furthermore, wireless device 110 may perform downconversion separately for each antenna. For example, wireless device 110 may receive transmissions on two sets of carriers via two antennas 310 and 312. Wireless device 110 may then perform downconversion separately for (i) a first set of carriers for primary antenna 310, (ii) the first set of carriers for secondary antenna 312, (iii) a second set of carriers for primary antenna 310, and (iv) the second set of carriers for secondary antenna 312. Wireless device 110 may perform downconversion for the first set of carriers for both antennas 310 and 312 using LO signals at a first frequency, which may be determined based on the center frequencies of the carriers in the first set. Wireless device 110 may perform downconversion for the second set of carriers for both antennas 310 and 312 using LO signals at a second frequency, which may be determined based on the center frequencies of the carriers in the second set.

Figure 4A:
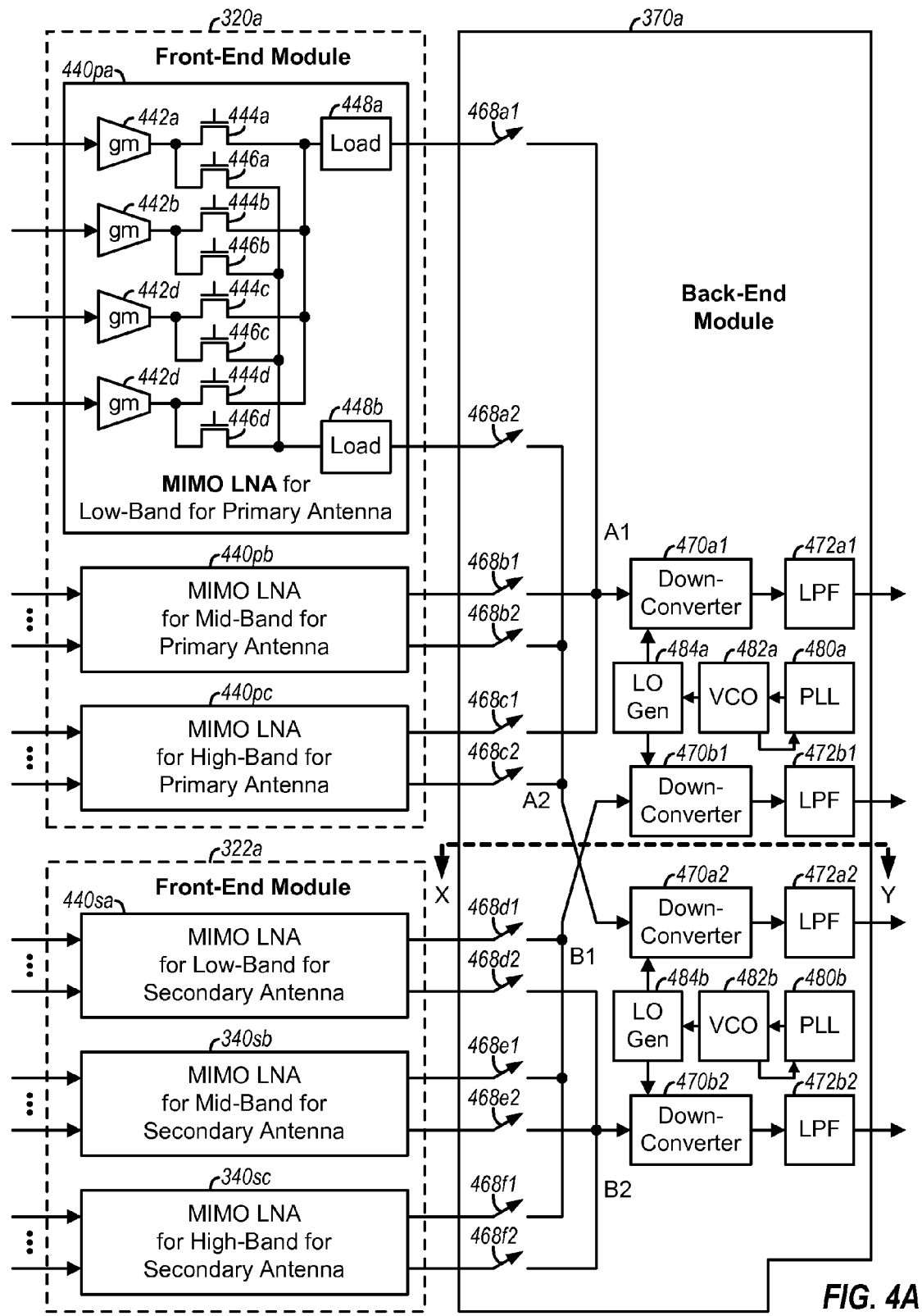
FIGS. 4A to 6 show some exemplary designs of front-end and back-end modules within the wireless device.

FIG. 4A shows a schematic diagram of front-end modules 320a and 322a and back-end module 370a, which are one exemplary design of front-end modules 320 and 322 and back-end module 370 in FIG. 3. In the exemplary design shown in FIG. 4A, front-end module 320a includes three MIMO LNAs 440pa, 440pb and 440pc for primary antenna 320 for low-band, mid-band, and high-band, respectively. Front-end module 322a includes three MIMO LNAs 440sa, 440sb and 440sc for secondary antenna 322 for low-band, mid-band, and high-band, respectively. MIMO LNAs 440 are one exemplary design of MIMO LNAs 340 in FIG. 3.

In the exemplary design shown in FIG. 4A, MIMO LNA 440pa is a 4×2 MIMO LNA with four inputs and two outputs. MIMO LNA 440pa includes four gain circuits 442a to 442d, eight cascode transistors 444a to 444d and 446a to 446d, and two load circuits 448a and 448b. Each gain circuit 442 may be implemented with a transistor having its gate receiving an input RF signal, its sources coupled to circuit ground directly or via a source degeneration inductor, and its drain coupled to the output of the gain circuit. Gain circuits 442a to 442d may be used for four bands in low-band and may be coupled to four duplexers or matching circuits within antenna interface circuit 324, which may provide one or two input RF signals to one or two of gain circuits 442a to 442d. Cascode transistors 444a to 444d have their sources coupled to the output of gain circuits 442a to 442d, respectively, and their drains coupled to load circuit 448a. Cascode transistors 446a to 446d have their sources coupled to the output of gain circuits 442a to 442d, respectively, and their drains coupled to load circuit 448b. Cascode transistors 444a to 444d and 446a to 446d receive different control signals, and each cascode transistor 444 or 446 may be turned on or off based on its control signal. Load circuit 448a provides a first amplified RF signal for a first set of carriers in low-band. Load circuit 448b provides a second amplified RF signal for a second set of carriers in low-band.

MIMO LNAs 440pa in FIG. 4A may provide various advantages. First, by combining the cascode transistors for each carrier set, the number of LNA outputs may be greatly reduced from eight to two. This may greatly reduce the number of I/O pins required to interface front-end modules 320 and 322 with back-end module 370. Second, each MIMO LNA 440 in FIG. 4A may provide its outputs to back-end module 370 instead of another front-end module. This may improve performance.

FIG. 4A shows an exemplary design of 4×2 MIMO LNA 440pa. In general, an N×M MIMO LNA with N inputs and M outputs may be implemented with N gain circuits, up to N*M cascode transistors, and M load circuits. The cascode transistors may be used to interconnect the N gain circuits to the M load circuits. Full interconnection may be obtained by using N*M cascode transistors to connect each gain circuit to each load circuit. Partial interconnection may be obtained by connecting a subset of the gain circuits (instead of all N gain circuits) to each load circuit.

MIMO LNAs 440pb, 440pc, 440sa, 440sb and 440sc may be implemented in similar manner as MIMO LNA 440pa in FIG. 4A. The N×M dimension of each MIMO LNA 440 may be dependent on various factors such as the number of bands supported in each band group, the number of sets of carriers on which transmissions may be sent simultaneously to wireless device 100, the number of available I/O pins, etc. In one exemplary design, MIMO LNAs 440pa, 440pc, 440sa and 440sc are 4×2 MIMO LNAs, and MIMO LNAs 440pb and 440sb are 6×2 MIMO LNAs. MIMO LNAs 440 may also have other dimensions.

In the exemplary design shown in FIG. 4A, back-end module 370a includes six pairs of switches 468 for the six MIMO LNAs 440. Switches 468a1, 468b1 and 468c1 have one end coupled to node A1 and the other end coupled to the first output of MIMO LNAs 440pa, 440pb and 440pc, respectively. Switches 468a2, 468b2 and 468c2 have one end coupled to node A2 and the other end coupled to the second output of MIMO LNAs 440pa, 440pb and 440pc, respectively. Switches 468d1, 468e1 and 468f1 have one end coupled to node B1 and the other end coupled to the first output of MIMO LNAs 440sa, 440sb and 440sc, respectively. Switches 468d2, 468e2 and 468f2 have one end coupled to node B2 and the other end coupled to the second output of MIMO LNAs 440sa, 440sb and 440sc, respectively.

In the exemplary design shown in FIG. 4A, switches 468 are implemented on back-end module 370a. It may be desirable to implement switches 468 on back-end module 370a since the switches may help with impedance matching between front-end modules 320 and 322 and back-end module 370a, e.g., if 50-ohm transmission lines are used between front-end modules 320 and 322 and back-end module 370a. The outputs of front-end modules 320 and 322 may be designed as 50-ohm outputs.

In another exemplary design, switches 468 are implemented on front-end modules 320 and 322 (instead of back-end module 370). This may reduce the number of RF interconnections between front-end modules 320 and 322 and back-end module 370. For example, the number of RF connections between front-end modules 320 and 322 and back-end module 370 may be reduced from 12 (as shown in FIG. 4A) to 4 (not shown in FIG. 4A) by implementing switches 468 on front-end modules 320 and 322.

In the exemplary design shown in FIG. 4A, back-end module 370a further includes two pairs of downconverters, which includes a first pair of downconverters 470a1 and 470b1 for a first set of carriers (or a first carrier set) and a second pair of downconverters 470a2 and 470b2 for a second set of carriers (or a second carrier set). Each pair of downconverters includes one downconverter 470a for primary antenna 310 and another downconverter 470b for secondary antenna 312. Wireless device 110 may simultaneously receive transmissions on up to two sets of carriers in up to two band groups. Up to two pairs of downconverters 470 may be used to perform downconversion for up to two sets of carriers, one pair of downconverters 470 for each set of carriers. Each enabled pair of downconverters 470 receives two amplified RF signals from two MIMO LNAs 440 coupled to two antennas 310 and 312 and separately downconverts the two amplified RF signals with two LO signals at the same frequency.

Downconverters 470a1 and 470b1 perform downconversion for the first carrier set in low-band, mid-band, or high-band. Switch 468a1, 468b1 or 468c1 is closed to route an amplified RF signal from the first output of MIMO LNA 440pa, 440pb or 440pc to downconverter 470a1. Switch 468d1, 468e1 or 468f1 is closed to route an amplified RF signal from the first output of MIMO LNA 440sa, 440sb or 440sc to downconverter 470b1. Downconverters 470a2 and 470b2 perform downconversion for the second carrier set in low-band, mid-band, or high-band. Switch 468a2, 468b2 or 468c2 is closed to route an amplified RF signal from the second output of MIMO LNA 440pa, 440pb or 440pc to downconverter 470a2. Switch 468d2, 468e2 or 468f2 is closed to route an amplified RF signal from the second output of MIMO LNA 440sa, 440sb or 440sc to downconverter 470b2.

In the exemplary design shown in FIG. 4A, back-end module 370a further includes (i) lowpass filters 472a1 and 472b1 for downconverters 470a1 and 470b1 for the first carrier set and (ii) lowpass filters 472a2 and 472b2 for downconverters 470a2 and 470b2 for the second carrier set. Lowpass filter 472a receives and filters a downconverted signal from downconverter 470a1 and provides an output baseband signal for the first carrier set for primary antenna 310. Lowpass filter 472b receives and filters a downconverted signal from downconverter 470b1 and provides an output baseband signal for the first carrier set for secondary antenna 312. Lowpass filter 472a2 receives and filters a downconverted signal from downconverter 470a2 and provides an output baseband signal for the second carrier set for primary antenna 310. Lowpass filter 472b2 receives and filters a downconverted signal from downconverter 470b2 and provides an output baseband signal for the second carrier set for secondary antenna 312. Lowpass filters 472a1 and 472b1 may have a fixed bandwidth or a configurable bandwidth, which may be dependent on the bandwidths of the carriers in the first carrier set. Lowpass filters 472a2 and 472b2 may also have a fixed bandwidth or a configurable bandwidth, which may be dependent on the bandwidths of the carriers in the second carrier set.

In the exemplary design shown in FIG. 4A, back-end module 370a further includes (i) a PLL 480a, a voltage-controlled oscillator (VCO) 482a, and an LO generator 484a for the first carrier set and (ii) a PLL 480b, a VCO 482b, and an LO generators 484b for the second carrier set. Each PLL 480 may include a phase-frequency detector, a charge pump, a loop filter, a frequency divider, etc. Each LO generator 484 may include a frequency divider, buffers, etc.

VCO 482a generates a first VCO signal at a first VCO frequency, which may be determined based on the frequencies of the carriers in the first carrier set. PLL 480a provides a first control signal to adjust the oscillation frequency of VCO 482a so that the first VCO frequency is at a target frequency for the first carrier set. This target frequency may be dependent on the frequencies of the carriers in the first carrier set, which may in turn be dependent on whether the first carrier set is in low-band, mid-band, or high-band. LO generator 484a receives the first VCO signal from VCO 482a and provides LO signals to downconverters 470a1 and 470b1.

Similarly, VCO 482b generates a second VCO signal at a second VCO frequency, which may be determined based on the frequencies of the carriers in the second carrier set. PLL 480b provides a second control signal to adjust the oscillation frequency of VCO 482b so that the second VCO frequency is at a target frequency for the second carrier set. This target frequency may be dependent on the frequencies of the carriers in the second carrier set, which may in turn be dependent on whether the second carrier set is in low-band, mid-band, or high-band. LO generator 484b receives the second VCO signal from VCO 482b and provides LO signals to downconverters 470a2 and 470b2.

In the exemplary design shown in FIG. 4A, each downconverter pair includes two downconverters 470 for two antennas 310 and 312 for one carrier set in one band. The two downconverters 470 in each pair receive LO signals at the same frequency from an associated LO generator 484. The two downconverters 470 in each pair are placed close together in order to shorten the routing of the LO signals from the associated LO generator 484. The two downconverters 470 in each pair receive two amplified RF signals from two MIMO LNAs 440. One or both amplified RF signals for each downconverter pair may be routed via a relatively long signal trace in order to reach the downconverters. For example, downconverters 470a1 and 470b1 are for the first carrier set and are placed close together in order to shorten the signal traces from LO generator 484a to downconverters 470a1 and 470b1. A first amplified RF signal from MIMO LNA 440pa for primary antenna 310 may be routed over a relatively long signal trace to downconverter 470a1. A second amplified RF signal from MIMO LNA 440sa for secondary antenna 312 may be routed over a relatively short signal trace to downconverter 470b1.

The closeness of the two downconverters 470 in each pair of downconverters may be quantified in various manners. In one exemplary design, the two downconverters 470 in each pair may be placed closer than a predetermined distance, which may be selected to obtain good performance, e.g., sufficiently low power consumption for LO generators 484. In another exemplary design, for each pair of downconverters, the routing distance $d_{LO}$ of the LO signals from the LO generator to the downconverters may be shorter than (i) the routing distance $d_{SIG1}$ of the first amplified RF signal provided to a first downconverter in the pair and/or (ii) the routing distance $d_{SIG2}$ of the second amplified RF signal provided to a second downconverter in the pair. The closeness of the two downconverters 470 in each pair may also be quantified in other manners.

Placing each pair of downconverters 470 sharing the same LO generator 484 close to each other may reduce the signal traces for the LO signals from LO generator 484 to downconverters 470. The shorter signal traces for the LO signals may provide various advantages such as reduced power consumption of LO generators 484, less radiation of the LO signals, etc.

In the exemplary design shown in FIG. 4A, back-end module 370a may be symmetric about line XY. The circuits within back-end module 370a may be fabricated on an IC die. The entire IC die may be used for a wireless device supporting carrier aggregation on two antennas. The IC die may be split at line XY. Each half of the IC die can support operation via a single antenna without receive diversity. Each half of the IC die may be used for a wireless device not supporting receive diversity.

Figure 4B:
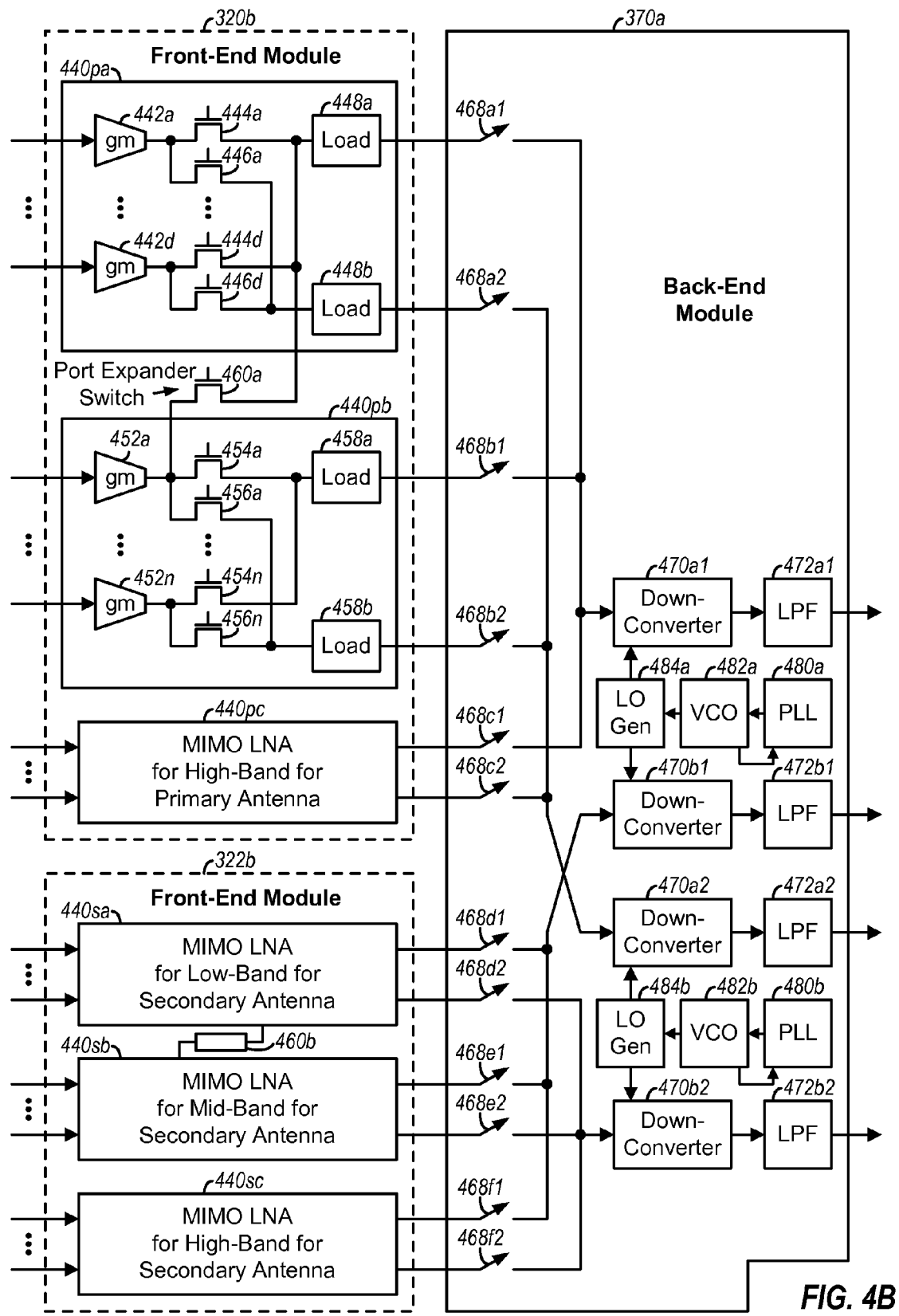

FIG. 4B shows a schematic diagram of front-end modules 320b and 322b, which are another exemplary design of front-end modules 320 and 322 in FIG. 3. Front-end module 320b includes three MIMO LNAs 440pa, 440pb and 440pc for primary antenna 310 for low-band, mid-band, and high-band, respectively. Front-end module 322b includes three MIMO LNAs 440sa, 440sb and 440sc for secondary antenna 312 for low-band, mid-band, and high-band, respectively. MIMO LNA 440pa for low-band includes four gain circuits 442a to 442d, eight cascode transistors 444a to 444d and 446a to 446d, and two load circuits 448a and 448b, which are coupled as described above for FIG. 4A.

MIMO LNA 440pb for mid-band includes N gain circuits 452a to 452n, 2N cascode transistors 454a to 454n and 456a to 456n, and two load circuits 458a and 458b, where N>1 in general and N=6 in one exemplary design. Gain circuits 452a to 452n may be coupled to N duplexers or matching circuits within antenna interface circuit 324, which may provide one or two input RF signals to one or two of gain circuits 452a to 452n. Cascode transistors 454a to 454n have their sources coupled to the output of gain circuits 452a to 452n, respectively, and their drains coupled to load circuit 458a. Cascode transistors 456a to 456n have their sources coupled to the output of gain circuits 452a to 452n, respectively, and their drains coupled to load circuit 458b. Cascode transistors 454a to 454n and 456a to 456n receive different control signals, and each cascode transistor 454 or 456 may be turned on or off based on its control signal. Load circuit 458a provides a first amplified RF signal for a first set of at least one carrier in mid-band. Load circuit 458b provides a second amplified RF signal for a second set of at least one carrier in mid-band.

In the exemplary design shown in FIG. 4B, a cascode transistor 460a has its source coupled to the output of gain circuit 452a within MIMO LNA 440pb, its gate receiving a control signal, and its drain coupled to load circuit 448a within MIMO LNA 440pa. Cascode transistor 460 functions as a port expander switch that can route an RF signal from MIMO LNA 440pb for mid-band to MIMO LNA 440pa for low-band. Gain circuit 452a within MIMO LNA 440pb may be operated at low-band and may provide its amplified RF signal via cascode transistor 460a to load circuit 448a within MIMO LNA 440pa. The number ports for low-band may be effectively increased from four to five with the use of the port expander. A cascode transistor 460b may be coupled between MIMO LNAs 440sa and 440sb and may act as a port expander for MIMO LNA 460sa.

In general, one or more port expanders may be used between any pair of MIMO LNAs. Each port expander may be coupled between a gain circuit in one MIMO LNA and a load circuit in another MIMO LNA. More port expanders may be used to effectively increase the number of ports of a MIMO LNA.

Figure 5:
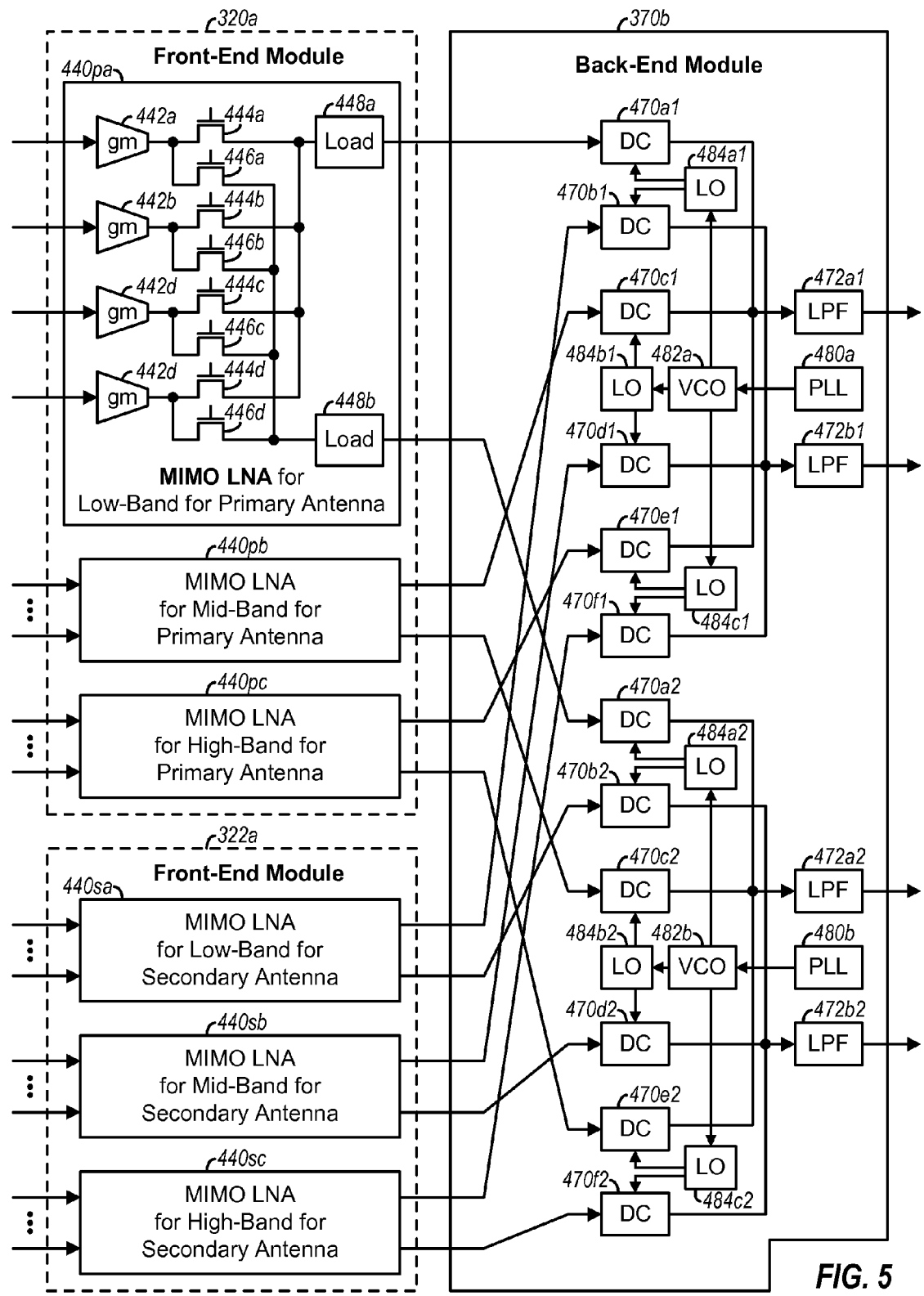

FIG. 5 shows a schematic diagram of back-end module 370b, which is another exemplary design of back-end module 370 in FIG. 3. In the exemplary design shown in FIG. 5, back-end module 370b includes six pairs of downconverters (DC) 470, as follows:

First pair of downconverters 470a1 and 470b1 for first carrier set in low-band,
Second pair of downconverters 470c1 and 470d1 for first carrier set in mid-band,
Third pair of downconverters 470e1 and 470f1 for first carrier set in high-band,
Fourth pair of downconverters 470a2 and 470b2 for second carrier set in low-band,
Fifth pair of downconverters 470c2 and 470d2 for second carrier set in mid-band, and
Sixth pair of downconverters 470e2 and 470f2 for second carrier set in high-band.

Downconverters 470a1, 470c1 and 470e1 are for primary antenna 310 for low-band, mid-band, and high-band, respectively, and have their outputs coupled together and to the input of lowpass filter 472a1. Similarly, downconverters 470b1, 470d1 and 470f1 are for secondary antenna 312 for low-band, mid-band, and high-band, respectively, and have their outputs coupled together and to the input of lowpass filter 472b1. Lowpass filter 472a1 receives and filters a downconverted signal from downconverters 470a1, 470c1 or 470e1 and provides an output baseband signal for the first carrier set for primary antenna 310. Similarly, lowpass filter 472b1 receives and filters a downconverted signal from downconverters 470b1, 470d1 or 470f1 and provides an output baseband signal for the first carrier set for secondary antenna 312. Each lowpass filter 472 may have a fixed bandwidth or a configurable bandwidth, which may be dependent on the bandwidths of the carriers in the first carrier set. Lowpass filter 472a2 and 472b2 are coupled to downconverters 470a2 to 470f2 in the same way that lowpass filter 472a1 and 472b1 are coupled to downconverters 470a1 to 470f1. Lowpass filter 472a2 receives and filters a downconverted signal from downconverters 470a2, 470c2 or 470e2 and provides an output baseband signal for the second carrier set for primary antenna 310. Similarly, lowpass filter 472b2 receives and filters a downconverted signal from downconverters 470b2, 470d2 or 470f2 and provides an output baseband signal for the second carrier set for secondary antenna 312.

VCO 482a generates a first VCO signal at a first VCO frequency and is controlled by PLL 480a. LO generator 484a1 generates LO signals at a first frequency for downconverters 470a1 and 470b1. LO generator 484b1 generates LO signals at a second frequency for downconverters 470c1 and 470d1. LO generator 484c1 generates LO signals at a third frequency for downconverters 470e1 and 470f1. VCO 482b generates a second VCO signal at a second VCO frequency and is controlled by PLL 480b. LO generator 484a2 generates LO signals at a fourth frequency for downconverters 470a2 and 470b2. LO generator 484b2 generates LO signals at a fifth frequency for downconverters 470c2 and 470d2. LO generator 484c2 generates LO signals at a sixth frequency for downconverters 470e2 and 470f2.

Figure 6:
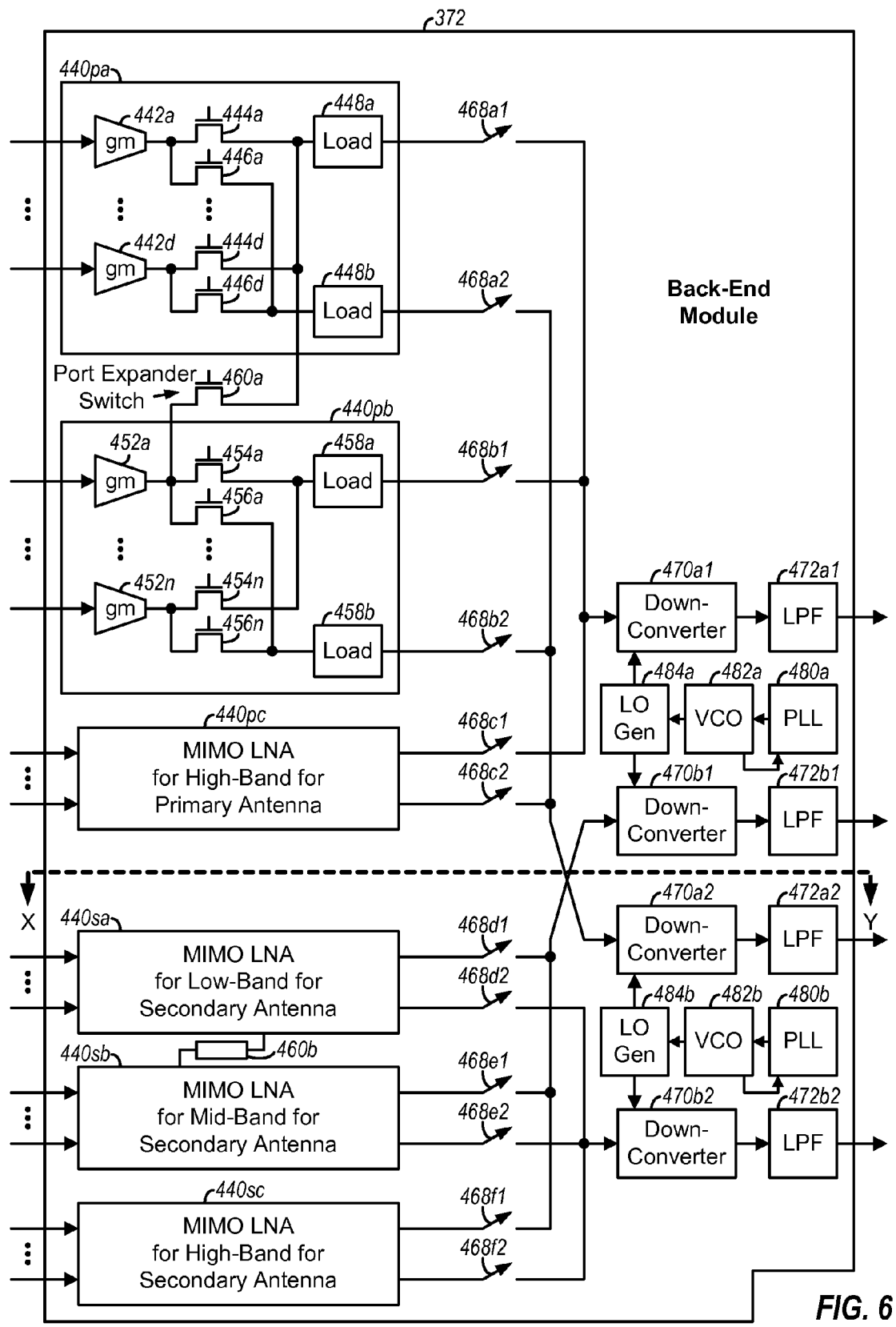

FIG. 6 shows a schematic diagram of an exemplary design of a back-end module 372. In this exemplary design, back-end module 372 includes MIMO LNAs 440pa, 440pb, 440pc, 440sa, 440sb and 440sc, switches 468, and all of the circuits in back-end module 370a in FIG. 4A. Integrating MIMO LNAs 440 and downconverters 470 within the same back-end module 372 (e.g., the same IC die) may provide certain advantages such as improved performance, higher level of integration, lower cost, etc. Back-end module 372 may be coupled to one or more front-end modules. In one exemplary design, back-end module 372 may be coupled to (i) a first front-end module including an antenna interface circuit and power amplifiers for a primary antenna and (ii) a second front-end module including an antenna interface circuit for a secondary antenna. In another exemplary design, back-end module 372 may be coupled to a single front-end module including antenna interface circuits for both primary and secondary antennas and power amplifiers.

In the exemplary design shown in FIG. 6, back-end module 372 may be symmetric about line XY. The circuits within back-end module 372 may be fabricated on an IC die. The IC die may be split at line XY. Each half of the IC die may include one half of the MIMO LNAs and one half of the downconverters. Each half of the IC die can support operation via a single antenna without receive diversity. This symmetric layout of back-end module 372 may provide certain advantages such as savings in design effort and faster to time to market based on good upfront planning.

FIGS. 3 to 5 show an exemplary design in which MIMO LNAs are implemented on front-end modules. FIG. 6 shows an exemplary design in which MIMO LNAs are implemented on a back-end module. This exemplary design may result in more RF routing between the front-end modules and the back-end module depending on the number of inputs and the number of outputs of each MIMO LNA. Within the back-end module, the outputs of the MIMO LNAs may be coupled to downconverters as shown in FIG. 4A, 4B, 5 or 6 to obtain the advantages described below.

Figure 7:
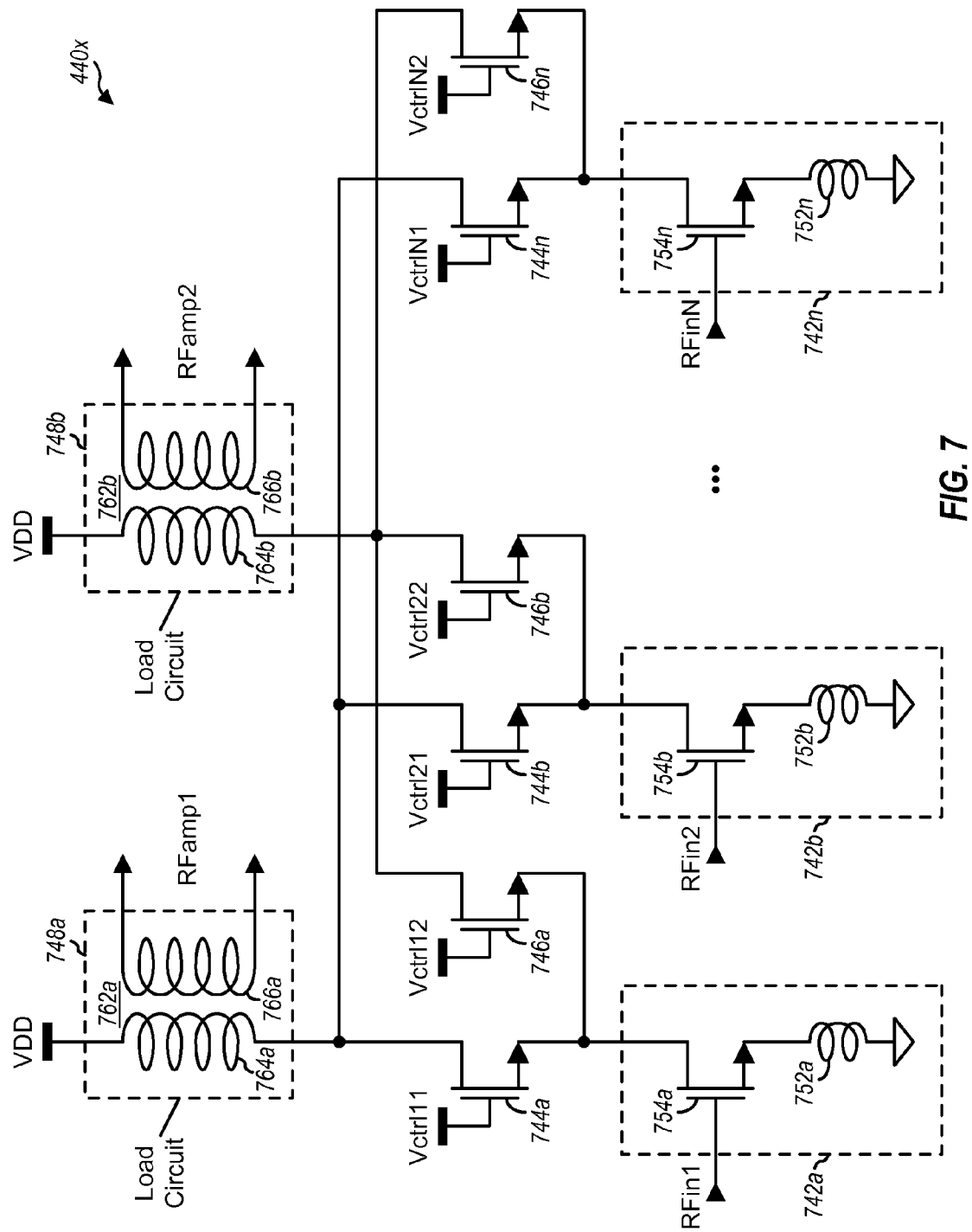
FIGS. 7 and 8 show two exemplary designs of a multiple-input multiple-output (MIMO) low noise amplifier (LNA).

FIG. 7 shows a schematic diagram of an exemplary design of an N×2 MIMO LNA 440x based on a split cascode architecture. MIMO LNA 440x may be used for each of MIMO LNA 440 in FIGS. 4A to 6. MIMO LNA 440x includes N gain circuits 742a to 742n coupled to N LNA inputs, 2N cascode transistors 744a to 744n and 746a to 746n, and two load circuits 748a and 748b coupled to two LNA outputs. Gain circuit 742a includes an N-channel metal oxide semiconductor (NMOS) transistor 754a having its gate receiving a first input RF signal (RFin1) via one LNA input and its source coupled to one end of a source degeneration inductor 752a. The other end of inductor 752a is coupled to circuit ground. Two cascode transistors 744a and 746a are coupled between gain circuit 742a and load circuits 748a and 748b. Cascode transistors 744a and 746a have their sources coupled to the drain of gain transistor 754a, their gates receiving control signals Vctrl11 and Vctrl12, respectively, and their drains coupled to load circuits 748a and 748b, respectively. Gain circuits 742b to 742n and cascode transistors 744b to 744n and 746b to 746n are coupled in similar manner as gain transistor 742a and cascode transistors 744a and 746a.

In the exemplary design shown in FIG. 7, load circuit 748a includes a transformer 762a comprising (i) a primary coil 764a coupled between the drains of cascode transistors 744a to 744n and a power supply, VDD, and (ii) a secondary coil 766a providing a differential first amplified RF signal (RFamp1). Load circuit 748b includes a transformer 762b having (i) a primary coil 764b coupled between the drains of cascode transistors 746a to 746n and the VDD supply and (ii) a secondary coil 766b providing a differential second amplified RF signal (RFamp2).

Load circuits 748 may also be implemented in other manners. In another exemplary design, a load circuit may include an inductor and possibly a capacitor coupled between the VDD supply and the drains of the cascode transistors. The cascode transistors may provide the amplified RF signal at their drains. In yet another exemplary design, a load circuit may include a P-channel metal oxide semiconductor (PMOS) transistor having its source coupled to the VDD supply and its drain coupled to the drains of the cascode transistors. The PMOS transistor may provide an active load for one or more cascode transistors.

MIMO LNA 440x may support a single-output mode, an intra-band CA mode, an inter-band CA mode for the same band group, and an inter-band CA mode for different band groups. In the single-output mode and the inter-band CA mode for different band groups, a single input RF signal may be received via one of the N LNA inputs and applied to a single gain circuit 742. This gain circuit 742 is coupled to a single load circuit 748 via a single cascode transistor 744 or 746. A single amplified RF signal for one set of carriers is provided by the single load circuit 748 to one LNA output. MIMO LNA 440x can support the single-output mode and the inter-band CA mode with an input RF signal applied to any one of the N gain circuits 742.

In the intra-band CA mode, a single input RF signal may be received via one of the N LNA inputs and applied to a single gain circuit 742. This gain circuit 742 is coupled to both load circuits 748a and 748b via two cascode transistors 744 and 746 coupled to the gain circuit. Two amplified RF signals for two sets of carriers are provided by the two load circuits 748a and 748b to the two LNA outputs. MIMO LNA 440x can allow an input RF signal to be applied to any gain circuit 742 and routed to any load circuit 748.

In the inter-band CA mode for the same band group, two input RF signals for two bands are received via two of the N LNA inputs and applied to two gain circuits 742. One gain circuit 742 is coupled to one load circuit 748 via one cascode transistor 744. The other gain circuit 742 is coupled to the other load circuit 748 via another cascode transistor 746. Two amplified RF signals for two sets of carriers are provided by two load circuits 748a and 748b to the two LNA outputs.

Figure 8:
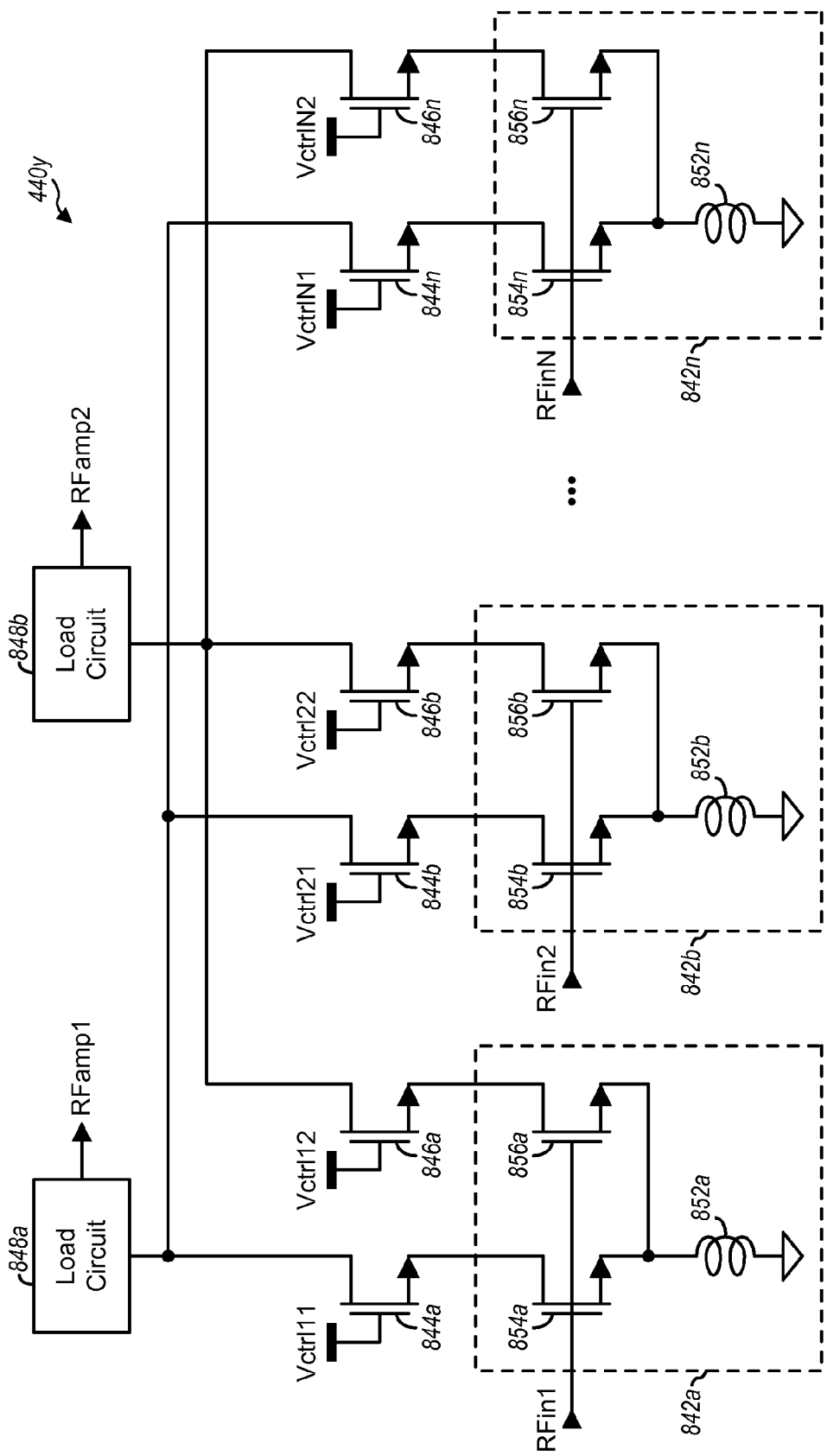

FIG. 8 shows a schematic diagram of an exemplary design of an N×2 MIMO LNA 440y based on a split gm architecture. MIMO LNA 440y may be used for each of MIMO LNA 440 in FIGS. 4A to 6. MIMO LNA 440y includes N gain circuits 842a to 842n coupled to N LNA inputs, 2N cascode transistors 844a to 844n and 846a to 846n, and two load circuits 848a and 848b coupled to two LNA outputs. Gain circuit 842a includes two NMOS transistors 854a and 856a having their gates receiving a first input RF signal (RFin1) via one LNA input and their sources coupled to one end of a source degeneration inductor 852a. The other end of inductor 852a is coupled to circuit ground. Two cascode transistors 844a and 846a are coupled between gain circuit 842a and load circuits 848a and 848b, respectively. Cascode transistors 844a and 846a have their sources coupled to the drains of gain transistors 854a and 856a, respectively, their gates receiving control signals Vctrl11 and Vctrl12, respectively, and their drains coupled to load circuits 848a and 848b, respectively. Gain circuits 842b to 842n and cascode transistors 844b to 844n and 846b to 846n are coupled in similar manner as gain transistor 842a and cascode transistors 844a and 846a. MIMO LNA 440y may support the single-output mode, the intra-band CA mode, the inter-band CA mode for the same band group, and the inter-band CA mode for different band groups, as described above for MIMO LNA 440x in FIG. 7.

FIGS. 7 and 8 show two exemplary designs of a MIMO LNA. A MIMO LNA may also be implemented in other manners. For example, a gain circuit within a MIMO LNA may include a gain transistor having its source coupled directly to circuit ground instead of to a source degeneration inductor.

Figure 9:
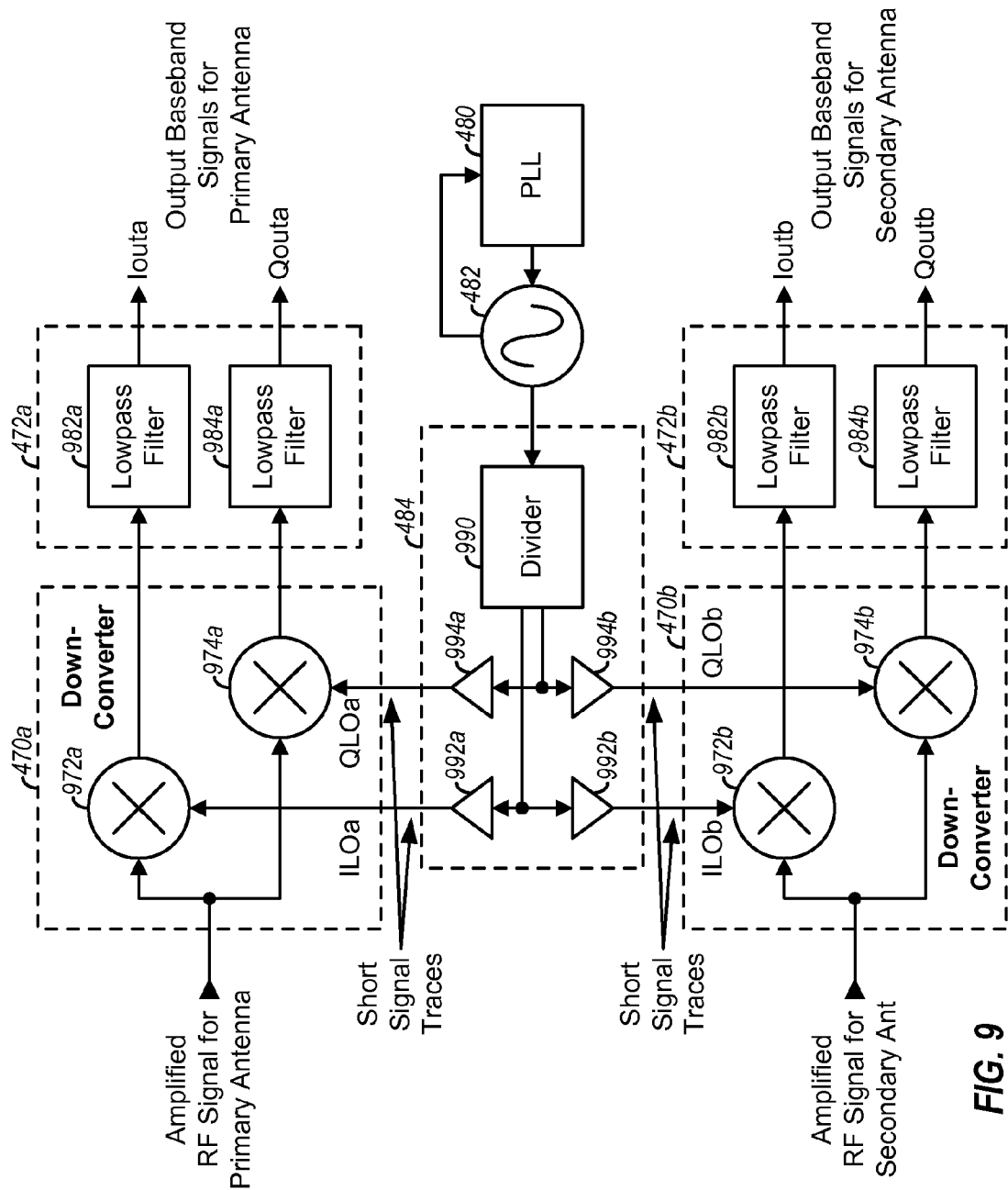
FIG. 9 shows an exemplary design of a pair of downconverters.

FIG. 9 shows an exemplary design of a pair of downconverters 470a and 470b and lowpass filters 472a and 472b, which may be used for any pair of downconverters 470 and associated lowpass filters 472 in FIGS. 4A to 6.

Downconverter 470a includes a pair of mixers 972a and 974a that performs quadrature downconversion for an amplified RF signal (RFampp) from a MIMO LNA for primary antenna 310. Mixer 972a receives the RFampp signal and an inphase LO signal (ILOa) from LO generator 484, downconverts the RFampp signal with the ILOa signal, and provides an inphase (I) downconverted signal. Mixer 974a receives the RFampp signal and a quadrature LO signal (QLOa), downconverts the RFampp signal with the QLOa signal, and provides a quadrature (Q) downconverted signal. Lowpass filters 472a includes a first lowpass filter 982a for the I path and a second lowpass filter 984a for the Q path. Filters 982a and 984a receive and filter the I and Q downconverted signals from mixers 972a and 974a, respectively, and provide I and Q baseband output signals for one set of carriers for primary antenna 310.

Downconverter 470b includes a pair of mixers 972b and 974b that performs quadrature downconversion for an amplified RF signal (RFamps) from a MIMO LNA for secondary antenna 312. Mixers 972b and 974b receive and downconvert the RFamps signal with inphase and quadrature LO signals (ILOb and QLOb) respectively, from LO generator 484, and provide I and Q downconverted signals, respectively. Lowpass filters 982b and 984b within lowpass filter 472b receive and filter the I and Q downconverted signals from mixers 972b and 974b, respectively, and provide I and Q baseband output signals for one set of carriers for secondary antenna 312.

FIG. 9 also shows an exemplary design of LO generator 484, which includes a frequency divider 990 and buffers 992a, 992b, 994a and 994b. Divider 990 receives a VCO signal from a VCO 482, divides the VCO signal in frequency by an integer or non-integer ratio, and provides I and Q LO signals at a target frequency for one set of carriers being received. The I LO signal is offset from the Q LO signal by 90° at the target frequency. The I LO signal is buffered by buffers 992a and 992b to generate ILOa and ILOb signals for mixers 972a and 972b, respectively, within downconverters 472a and 472b. The Q LO signal is buffered by buffers 994a and 994b to generate QLOa and QLOb signals for mixers 974a and 974b, respectively, within downconverters 472a and 472b.

The carrier aggregation receiver architecture disclosed herein may provide various advantages. First, the receiver architecture may support all CA schemes shown in FIGS. 2A to 2D with receive diversity. The receiver architecture may use a relatively small number of RF interconnections between front-end modules 320 and 322 and back-end module 370. This may result in a smaller die area for back-end module 370, a smaller package area for front-end modules 320 and 322, and reduced routing area on a PCB that includes front-end modules 320 and 322 and back-end module 370. Second, each MIMO LNA may include any number of gain circuits for any number of bands without increasing the number of output pins on front-end modules 320 and 322. This may be especially desirable for wireless devices supporting multiple bands simultaneously.

Third, power consumption of LO generators may be reduced by (i) placing each pair of downconverters 470 and its associated LO generator 484 close together and (ii) running short signal traces from the LO generators to the downconverters. Fourth, a back-end module may include identical circuits for the two sets of carriers, e.g., as shown in FIGS. 4A and 6. An IC die of the back-end module may be physically split into two, and each half may be used for a wireless device to support operation on one set of carriers (i.e., no carrier aggregation) via two antennas. This may be achieved without having to redesign a wireless device not supporting carrier aggregation. Fifth, MIMO LNAs 440 within front-end module 320 may be similar or identical to MIMO LNAs 440 within front-end module 322. As a result, for operation on a single set of carriers, the output ports of MIMO LNAs 440 may provide amplified RF signals for primary antenna 310 and secondary antenna 312 (instead of amplified RF signals for two sets of carriers). Hence, MIMO LNAs 440 may be reused to support receive diversity with two antennas instead of carrier aggregation on two sets of carriers.

In an exemplary design, an apparatus (e.g., a wireless device, an IC, a circuit module, etc.) may include a plurality of LNAs, a plurality of switches, and at least one downconverter. The plurality of LNAs (e.g., LNAs 440 in FIG. 4A) may receive and amplify at least one input RF signal and provide at least one amplified RF signal. The plurality of switches (e.g., switches 468) may be coupled to the outputs of the plurality of LNAs. The at least one downconverter (e.g., downconverters 470) may be coupled to the plurality of switches and may downconvert the at least one amplified RF signal and provide at least one downconverted signal. The switches may reduce the number of downconverters needed to support reception of transmissions on multiple sets of carriers via multiple receive antennas, e.g., shown by comparing FIG. 4A to FIG. 6.

In an exemplary design, the plurality of LNAs may comprise (i) a first set of LNAs (e.g., LNAs 440pa, 440pb and 440pc) for a first antenna (e.g., primary antenna 310) and (ii) a second set of LNAs (e.g., LNAs 440sa, 440sb and 440sc) for a second antenna (e.g., secondary antenna 312). The first set of LNAs may include at least two LNAs for at least two band groups, e.g., three LNAs 440pa, 440pb and 440pc for three band groups of low-band, mid-band, and high-band. The second set of LNAs may include at least two additional LNAs for the at least two band groups, e.g., e.g., three LNAs 440sa, 440sb and 440sc for the three band groups of low-band, mid-band, and high-band.

In an exemplary design, each of the plurality of LNAs may comprise M outputs and may provide up to M amplified RF signals from up to M outputs, where M may be any integer greater than one. For example, each LNA may comprise two outputs and may provide up to two amplified RF signals from up to two outputs for up to two sets of carriers. Each LNA may comprise a plurality of gain circuits and a plurality of cascode transistors. In one exemplary design, each gain circuit may comprise a gain transistor (e.g., gain transistor 754 in FIG. 7) coupled between an input and an output of the gain circuit. The plurality of cascode transistors (e.g., cascode transistors 744 and 746 in FIG. 7) may be coupled between the plurality of gain circuits and a plurality of load circuits for the LNA. In another exemplary design, each gain circuit may comprise first and second gain transistors (e.g., transistors 854 and 856 in FIG. 8) coupled between an input and first and second outputs of the gain circuit. The plurality of cascode transistors (e.g., cascode transistors 844 and 846 in FIG. 8) may be coupled between the first and second outputs of the plurality of gain circuits and the plurality of load circuits for the LNA.

In one exemplary design, the at least one downconverter may include first and second downconverters. The first downconverter (e.g., downconverter 470a1 in FIG. 4A) may be coupled to the first set of LNAs via a first subset of the plurality of switches. The second downconverter (e.g., downconverter 470*b*1 in FIG. 4A) may be coupled to the second set of LNAs via a second subset of the plurality of switches. The first downconverter may perform downconversion for a first amplified RF signal for the first antenna. The second downconverter may perform downconversion for a second amplified RF signal for the second antenna.

In another exemplary design, the at least one downconverter may include first to fourth downconverters. The plurality of LNAs may each comprise first and second outputs. The first downconverter (e.g., downconverter 470*a*1 in FIG. 4A) may be coupled to the first outputs of the first set of LNAs via a first subset of the plurality of switches (e.g., switches 468*a*1, 468*b*1 and 468*c*1 in FIG. 4A). The second downconverter (e.g., downconverter 470*b*1) may be coupled to the first outputs of the second set of LNAs via a second subset of the plurality of switches (e.g., switches 468*d*1, 468*e*1 and 468*f*1 in FIG. 4A). The third downconverter (e.g., downconverter 470*a*2) may be coupled to the second outputs of the first set of LNAs via a third subset of the plurality of switches (e.g., switches 468*a*2, 468*b*2 and 468*c*2 in FIG. 4A). The fourth downconverter (e.g., downconverter 470*b*2) may be coupled to the second outputs of the second set of LNAs via a fourth subset of the plurality of switches (e.g., switches 468*d*2, 468*e*2 and 468*f*2 in FIG. 4A). The first downconverter may perform downconversion for a first amplified RF signal for the first antenna for a first set of carriers. The second downconverter may perform downconversion for a second amplified RF signal for the second antenna for the first set of carriers. The third downconverter may perform downconversion for a third amplified RF signal for the first antenna for a second set of carriers. The fourth downconverter may perform downconversion for a fourth amplified RF signal for the second antenna for the second set of carriers.

In an exemplary design, the wireless device may further include first and second LO generators. The first LO generator (e.g., LO generator 484*a* in FIG. 4A) may be coupled to the first and second downconverters and may provide LO signals at a first frequency to the first and second downconverters. The second LO generator (e.g., LO generator 484*b*) may be coupled to the third and fourth downconverters and may provide LO signals at a second frequency to the third and fourth downconverters.

In an exemplary design, the first and second downconverters may be located close to each other (e.g., located within a predetermined distance of each other) in order to reduce signal routing from the first LO generator to the first and second downconverters. The predetermined distance may be quantified by one or more times the length or width dimension of a layout of one downconverter on an IC die. The first and second downconverters may be located closer to the first set of LNAs than the second set of LNAs (or vice versa). Similarly, the third and fourth downconverters may be located close to each other (e.g., located within the predetermined distance of each other) in order to reduce signal routing from the second LO generator to the third and fourth downconverters.

In one exemplary design, the wireless device may further include at least one switch operating as a port expander. Each such switch may be implemented with a cascode transistor (e.g., cascode transistor 460*a* in FIG. 4B) and may be coupled between two of the plurality of LNAs.

The wireless device may comprise at least one front-end module and a back-end module. In an exemplary design, the at least one front-end module (e.g., front-end modules 320 and 322 in FIG. 3) may comprise the plurality of LNAs. The back-end module (e.g., back-end module 370) may comprise the at least one downconverter. The back-end module may further comprise the plurality of switches. The switches may be implemented on the front-end module(s) instead of the back-end module. In another exemplary design, the plurality of LNAs, the plurality of switches, and the at least one downconverter may be implemented on the back-end module, e.g., as shown in FIG. 6.

Figure 10:
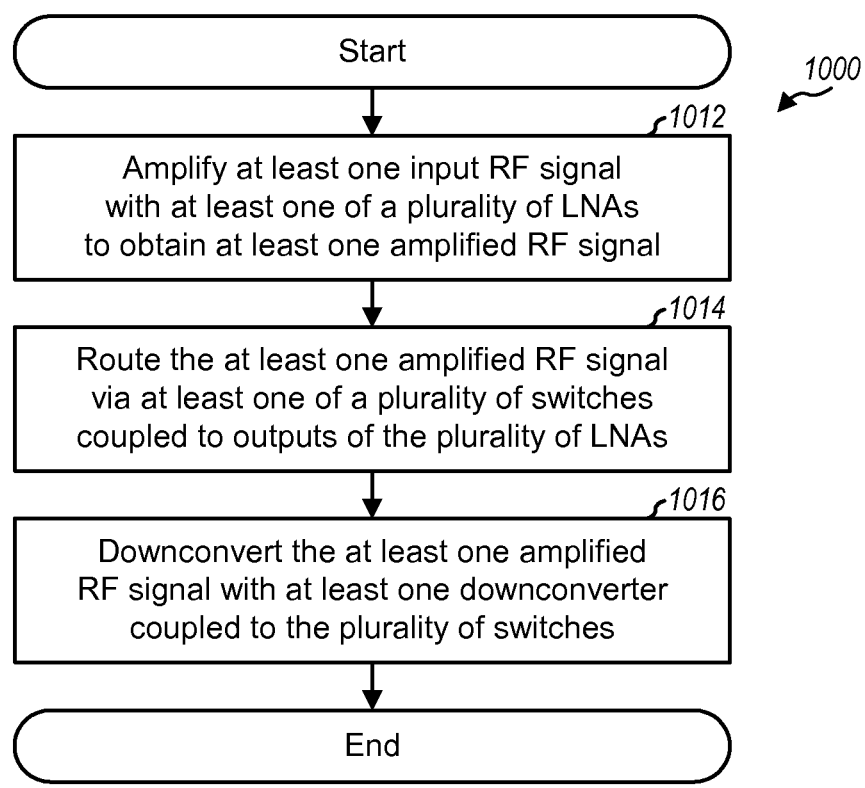
FIG. 10 shows a process for receiving transmissions in a wireless system.

FIG. 10 shows an exemplary design of a process 1000 for receiving transmissions in a wireless system. Process 1000 may be performed by a wireless device or by some other entity. At least one input RF signal may be amplified with at least one of a plurality of LNAs to obtain at least one amplified RF signal (block 1012). The at least one amplified RF signal may be routed via at least one of a plurality of switches coupled to the outputs of the plurality of LNAs (block 1014). The at least one amplified RF signal may be downconverted with at least one downconverter coupled to the plurality of switches (block 1016).

In one exemplary design, the plurality of LNAs may comprise a first set of LNAs (e.g., LNAs 440*pa*, 440*pb* and 440*pc* in FIG. 4A) for a first antenna and a second set of LNAs (e.g., LNAs 440*sa*, 440*sb* and 440*sc* in FIG. 4A) for a second antenna. Each LNA may comprise a first output for a first set of carriers and a second output for a second set of carriers. The at least one amplified RF signal may comprise a first amplified RF signal for the first antenna for the first set of carriers, a second amplified RF signal for the second antenna for the first set of carriers, a third amplified RF signal for the first antenna for the second set of carriers, and a fourth amplified RF signal for the second antenna for the second set of carriers.

For block 1016, the first amplified RF signal may be downconverted with a first downconverter (e.g., downconverter 470*a*1 in FIG. 4A) to obtain a first downconverted signal for the first antenna for the first set of carriers. The second amplified RF signal may be downconverted with a second downconverter (e.g., downconverter 470*b*1 in FIG. 4A) to obtain a second downconverted signal for the second antenna for the first set of carriers. The third amplified RF signal may be downconverted with a third downconverter (e.g., downconverter 470*a*2 in FIG. 4A) to obtain a third downconverted signal for the first antenna for the second set of carriers. The fourth amplified RF signal may be downconverted with a fourth downconverter (e.g., downconverter 470*b*2 in FIG. 4A) to obtain a fourth downconverted signal for the second antenna for the second set of carriers.

The LNAs, switches, downconverters, front-end modules, and back-end modules described herein may be implemented on one or more ICs, analog ICs, RFICs, mixed-signal ICs, PCBs, an electronic device, etc. The LNAs, switches, downconverters, front-end modules, and back-end modules may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the LNAs, switches, downconverters, front-end modules, and/or back-end modules described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   a plurality of low noise amplifiers (LNAs) configured to receive and amplify at least one input radio frequency (RF) signal and provide at least one amplified RF signal;
   a plurality of switches coupled to outputs of the plurality of LNAs; and
   at least one downconverter pair directly connected to a common local oscillator (LO) generator and to the plurality of switches and each downconverter of the at least one downconverter pair configured to concurrently downconvert with a common LO signal the at least one amplified RF signal and provide at least one downconverted signal, the at least one downconverter pair configured for coupling to a plurality of antennas.

2. The apparatus of claim 1, the plurality of LNAs comprising:
   a first set of LNAs for a first antenna, and
   a second set of LNAs for a second antenna.

3. The apparatus of claim 2, the first set of LNAs including at least two LNAs for at least two band groups, and the second set of LNAs including at least two additional LNAs for the at least two band groups.

4. The apparatus of claim 2, the at least one downconverter pair comprising:
   a first downconverter coupled to the first set of LNAs via a first subset of the plurality of switches, and
   a second downconverter coupled to the second set of LNAs via a second subset of the plurality of switches.

5. The apparatus of claim 2, each of the plurality of LNAs comprising first and second outputs, and the at least one downconverter pair comprising:
   a first downconverter coupled to first outputs of the first set of LNAs via a first subset of the plurality of switches,
   a second downconverter coupled to first outputs of the second set of LNAs via a second subset of the plurality of switches,
   a third downconverter coupled to second outputs of the first set of LNAs via a third subset of the plurality of switches, and
   a fourth downconverter coupled to second outputs of the second set of LNAs via a fourth subset of the plurality of switches.

6. The apparatus of claim 5, further comprising:
   a first local oscillator (LO) generator coupled to the first and second downconverters; and
   a second LO generator coupled to the third and fourth downconverters.

7. The apparatus of claim 1, wherein each downconverter of the at least one downconverter pair having a signal routing distance to the common LO generator that is shorter than a signal routing distance to the plurality of LNAs.

8. The apparatus of claim 6, the first downconverter being located within a predetermined distance of the second downconverter to reduce signal routing from the first LO generator to the first and second downconverters.

9. The apparatus of claim 1, further comprising:
   at least one switch, each switch coupled between two of the plurality of LNAs.

10. The apparatus of claim 1, each of the plurality of LNAs comprising M outputs and configured to provide up to M amplified RF signals from up to M outputs, where M is an integer greater than one.

11. The apparatus of claim 1, each LNA of the plurality of LNAs comprising:
    a plurality of gain circuits, each gain circuit comprising a gain transistor coupled between an input and an output of the gain circuit, and
    a plurality of cascode transistors coupled between the plurality of gain circuits and a plurality of load circuits for the LNA.

12. The apparatus of claim 1, each LNA of the plurality of LNAs comprising:
    a plurality of gain circuits, each gain circuit comprising first and second gain transistors coupled between an input and first and second outputs of the gain circuit, and
    a plurality of cascode transistors coupled between the first and second outputs of the plurality of gain circuits and a plurality of load circuits for the LNA.

13. The apparatus of claim 1, further comprising:
    at least one front-end module comprising the plurality of LNAs; and
    a back-end module comprising the at least one downconverter pair.

14. The apparatus of claim 13, the back-end module further comprising the plurality of switches.

15. The apparatus of claim 1, further comprising:
    a back-end module comprising the plurality of LNAs, the plurality of switches, and the at least one downconverter pair.

16. The apparatus of claim 15, the plurality of LNAs comprising a first set of LNAs and a second set of LNAs, the at least one downconverter pair comprising a first set of downconverters and a second set of downconverters, the first set of LNAs and the first set of downconverters being implemented on a first half of the back-end module, and the second set of LNAs and the second set of downconverters being implemented on a second half of the back-end module.

17. A method comprising:
   amplifying at least one input radio frequency (RF) signal with at least one of a plurality of low noise amplifiers (LNAs) to obtain at least one amplified RF signal;
   routing the at least one amplified RF signal via at least one of a plurality of switches coupled to outputs of the plurality of LNAs; and
   downconverting the at least one amplified RF signal with at least one downconverter pair directly connected to a common local oscillator (LO) generator and to the plurality of switches and each downconverter of the at least one downconverter pair configured to concurrently downconvert with a common LO signal the at least one amplified RF signal, the at least one downconverter pair configured for coupling to a plurality of antennas.

18. The method of claim 17, the plurality of LNAs comprising a first set of LNAs for a first antenna and a second set of LNAs for a second antenna, each LNA comprising first and second outputs, the at least one amplified RF signal comprising first to fourth amplified RF signals, and the downconverting comprising
   downconverting the first amplified RF signal with a first downconverter, coupled to first outputs of the first set of LNAs via a first subset of the plurality of switches, to obtain a first downconverted signal for the first antenna for a first set of carriers,
   downconverting the second amplified RF signal with a second downconverter, coupled to first outputs of the second set of LNAs via a second subset of the plurality of switches, to obtain a second downconverted signal for the second antenna for the first set of carriers,
   downconverting the third amplified RF signal with a third downconverter, coupled to second outputs of the first set of LNAs via a third subset of the plurality of switches, to obtain a third downconverted signal for the first antenna for a second set of carriers, and
   downconverting a fourth amplified RF signal with a fourth downconverter, coupled to second outputs of the second set of LNAs via a fourth subset of the plurality of switches, to obtain a fourth downconverted signal for the second antenna for the second set of carriers.

19. An apparatus comprising:
   means for amplifying comprising a plurality of inputs and a plurality of outputs and configured to receive at least one input radio frequency (RF) signal via at least one of the plurality of inputs, amplify the at least one input RF signal, and provide at least one amplified RF signal via at least one of the plurality of outputs;
   means for routing coupled to the means for amplifying and configured to receive and route the at least one amplified RF signal; and
   a pair of means for downconverting directly connected to a common local oscillator (LO) generator and to the means for routing and each means of the pair of means configured to concurrently downconvert with a common LO signal the at least one amplified RF signal, the means for downconverting configured for coupling to a plurality of antennas.

20. The apparatus of claim 19, the at least one amplified RF signal comprising first to fourth amplified RF signals, and the means for downconverting comprising
   means for downconverting the first amplified RF signal to obtain a first downconverted signal for a first antenna for a first set of carriers,
   means for downconverting the second amplified RF signal to obtain a second downconverted signal for a second antenna for the first set of carriers,
   means for downconverting the third amplified RF signal to obtain a third downconverted signal for the first antenna for a second set of carriers, and
   means for downconverting a fourth amplified RF signal to obtain a fourth downconverted signal for the second antenna for the second set of carriers.

* * * * *